(12) United States Patent
Yoo et al.

(10) Patent No.: US 12,002,519 B2
(45) Date of Patent: Jun. 4, 2024

(54) OPERATION METHOD OF CONTROLLER CONFIGURED TO CONTROL NONVOLATILE MEMORY DEVICE AND OPERATION METHOD OF STORAGE DEVICE

(71) Applicant: SAMSUNG ELECTRONICS CO., LTD., Suwon-si (KR)

(72) Inventors: Sangjin Yoo, Bucheon-si (KR); Yunjung Lee, Suwon-si (KR); Heewon Lee, Seoul (KR); Kwangwoo Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 209 days.

(21) Appl. No.: 17/534,989

(22) Filed: Nov. 24, 2021

(65) Prior Publication Data

US 2022/0172785 A1 Jun. 2, 2022

(30) Foreign Application Priority Data

Dec. 1, 2020 (KR) .......................... 10-2020-0166010

(51) Int. Cl.
*G11C 16/26* (2006.01)
*G11C 16/34* (2006.01)
*G11C 16/04* (2006.01)

(52) U.S. Cl.
CPC .......... *G11C 16/26* (2013.01); *G11C 16/3495* (2013.01); *G11C 16/0483* (2013.01)

(58) Field of Classification Search
CPC . G11C 11/5671; G11C 16/0483; G11C 16/26; G11C 16/349; G11C 16/3495; G11C 2029/0411; G11C 2211/5644; G11C 29/021; G11C 29/028; G11C 29/44
USPC ...................................................... 365/185.17
See application file for complete search history.

(56) References Cited

U.S. PATENT DOCUMENTS

| | | | |
|---|---|---|---|
| 8,737,136 B2 | 5/2014 | Cometti | |
| 9,514,830 B2 | 12/2016 | Han et al. | |
| 10,613,795 B2 | 4/2020 | Oh et al. | |
| 2013/0185612 A1 | 7/2013 | Lee et al. | |
| 2014/0359202 A1 | 12/2014 | Sun et al. | |
| 2020/0151539 A1 | 5/2020 | Oh et al. | |
| 2020/0210096 A1 | 7/2020 | Kim et al. | |
| 2021/0342206 A1* | 11/2021 | Sheperek | G11C 29/028 |
| 2022/0059181 A1* | 2/2022 | Sheperek | G11C 7/20 |

* cited by examiner

*Primary Examiner* — Ly D Pham
(74) *Attorney, Agent, or Firm* — Fish & Richardson P.C.

(57) ABSTRACT

Disclosed is an operation method of a controller which is configured to control a nonvolatile memory device. The method includes receiving cell counting data associated with selected memory cells included in the nonvolatile memory device from the nonvolatile memory device, adjusting operation parameters of the nonvolatile memory device based on the cell counting data, performing a valley search operation for the selected memory cells based on the adjusted operation parameters, and performing a read operation for the selected memory cells based on a result of the valley search operation.

20 Claims, 22 Drawing Sheets

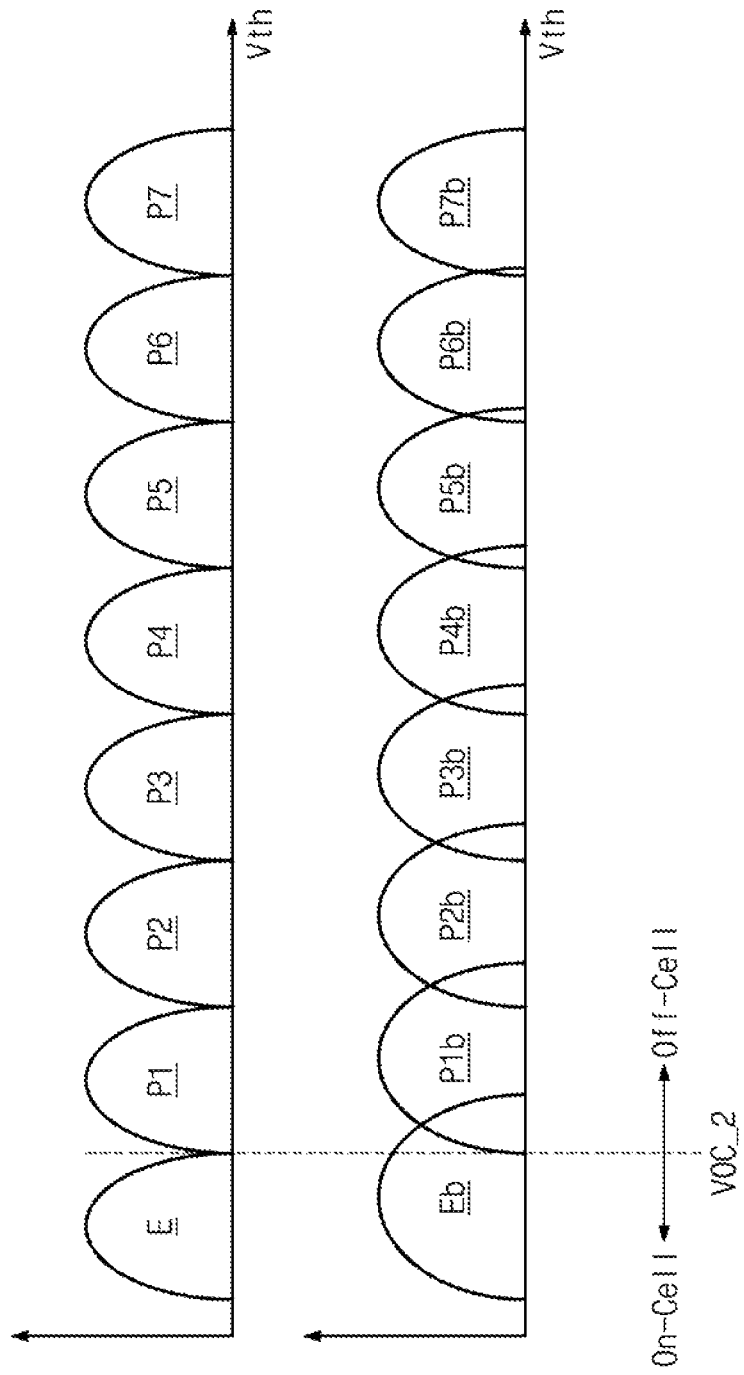

OPERATION METHOD OF CONTROLLER CONFIGURED TO CONTROL NONVOLATILE MEMORY DEVICE AND OPERATION METHOD OF STORAGE DEVICE

CROSS-REFERENCE TO RELATED APPLICATION

Korean Patent Application No. 10-2020-0166010 filed on Dec. 1, 2020 in the Korean Intellectual Property Office, and entitled: "Operation Method of Controller Configured to Control Nonvolatile Memory Device and Operation Method of Storage Device," is incorporated by reference herein in its entirety.

BACKGROUND

1. Field

Embodiments described herein relate to a semiconductor memory, and more particularly, relate to an operation method of a controller configured to control a nonvolatile memory device and an operation method of a storage device.

2. Description of the Related Art

A semiconductor memory may be classified as a volatile memory, in which stored data disappear when a power is turned off, such as a static random access memory (SRAM) or a dynamic random access memory (DRAM), or a nonvolatile memory, in which stored data are retained even when a power is turned off, such as a flash memory, a phase change RAM (PRAM), a magnetic RAM (MRAM), a resistive RAM (RRAM), or a ferroelectric RAM (FRAM). The flash memory is being widely used as a high-capacity storage medium of a computing system.

SUMMARY

Embodiments are directed to an operation method of a controller which is configured to control a nonvolatile memory device includes receiving cell counting data associated with selected memory cells included in the nonvolatile memory device from the nonvolatile memory device, adjusting operation parameters of the nonvolatile memory device based on the cell counting data, performing a valley search operation for the selected memory cells based on the adjusted operation parameters, and performing a read operation for the selected memory cells based on a result of the valley search operation.

According to an embodiment, an operation method of a storage device which includes a nonvolatile memory device and a controller includes transmitting, by the controller, a 0-th cell-counting command to the nonvolatile memory device, performing, by the nonvolatile memory device, a 0-th cell-counting operation based on at least one cell-counting voltage in response to the cell-counting command to transmit 0-th cell counting data to the controller, controlling, by the controller, operation parameters of the nonvolatile memory device based on the 0-th cell counting data, transmitting, by the controller, at least one first cell-counting command to the nonvolatile memory device, performing, by the nonvolatile memory device, at least one first cell-counting operation based on a voltage level corresponding to the controlled operation parameters in response to the at least one first cell-counting command to transmit at least one first cell counting data to the memory controller, controlling, by the controller, an optimal read level based on the at least one first cell counting data, transmitting, by the controller, a read command to the nonvolatile memory device, and performing, by the nonvolatile memory device, a read operation on selected memory cells based on the optimal read level in response to the read command to transmit data to the controller.

According to an embodiment, an operation method of a controller which is configured to control a nonvolatile memory device includes detecting degradation information about selected memory cells of the nonvolatile memory device, controlling operation parameters of the nonvolatile memory device based on the degradation information, receiving a plurality of cell counting data from the nonvolatile memory device, detecting optimal read levels based on the plurality of cell counting data, and reading data from the selected memory cells of the nonvolatile memory device by using the optimal read levels, and the detecting of the degradation information and the controlling of the operation parameters are performed based on machine learning.

BRIEF DESCRIPTION OF THE FIGURES

Features will become apparent to those of skill in the art by describing in detail example embodiments with reference to the attached drawings in which:

FIGS. 9A and 9B are diagrams for describing operation S131 of FIG. 8.

DETAILED DESCRIPTION

Figure 1:
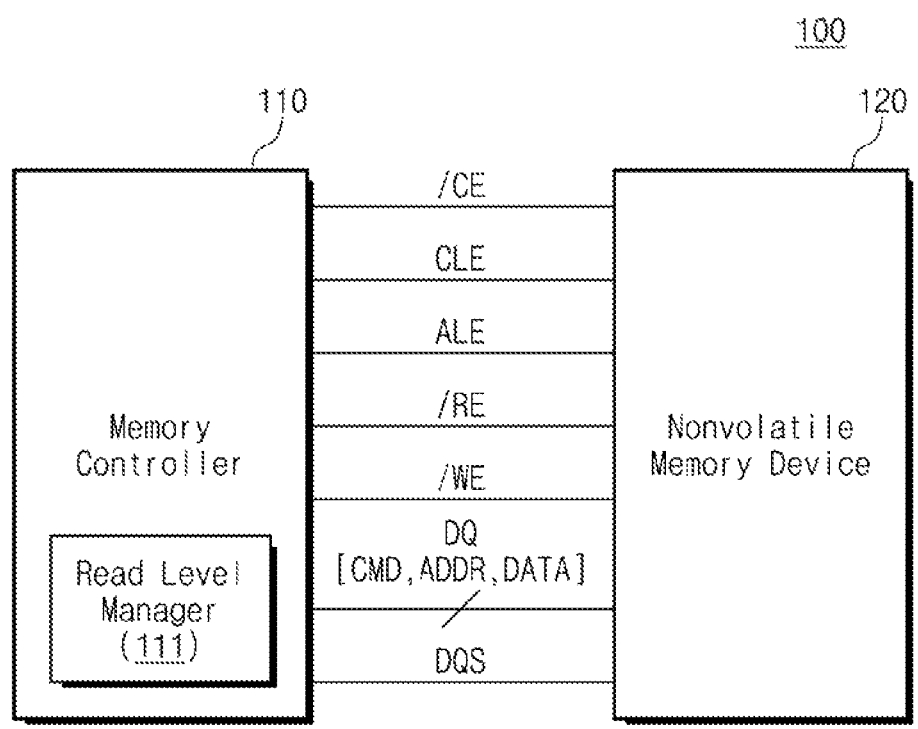
FIG. 1 is a block diagram illustrating a storage device according to an example embodiment.

FIG. 1 is a block diagram illustrating a storage device according to an example embodiment.

Referring to FIG. 1, a storage device 100 may include a memory controller 110 and a nonvolatile memory device 120.

The memory controller 110 may be configured to control the nonvolatile memory device 120. For example, the memory controller 110 may store data "DATA" in the nonvolatile memory device 120 or may read the data "DATA" stored in the nonvolatile memory device 120.

The nonvolatile memory device 120 may include a plurality of memory blocks. The nonvolatile memory device 120 may include a NAND flash memory device. However, the present disclosure is not limited thereto. For example, the nonvolatile memory device 120 may include various nonvolatile memory devices such as a magnetic RAM (MRAM), a phase change RAM (PRAM), and a resistive RAM (ReRAM).

The memory controller 110 and the nonvolatile memory device 120 may exchange a command CMD, an address ADDR, and the data "DATA" through a given interface. The given interface may be a toggle interface, but the present disclosure is not limited thereto. For example, the given interface may include various interfaces such as an open NAND flash interface (ONFI). Below, for convenience of description, it is assumed for convenience of explanation that the interface between the memory controller 110 and the nonvolatile memory device 120 is a toggle interface.

The memory controller 110 may transmit a chip enable signals /CE, a command latch enable signal CLE, an address latch enable signal ALE, a read enable signal /RE, and a write enable signal /WE to the nonvolatile memory device 120. The memory controller 110 and the nonvolatile memory device 120 may exchange a data signal DQ and a data strobe signal DQS.

Table 1 shows an example of an operation mode of the nonvolatile memory device 120 according to a state of each signal.

TABLE 1

| /CE | CLE | ALE | /WE | /RE | DQS | DQx | MODE |
|---|---|---|---|---|---|---|---|
| L | H | L | ↑ | H | X | CMD | Command Input |
| L | L | H | ↑ | H | X | ADDR | Address Input |
| L | L | L | H | H | ↑↓ | DATA_in | Data Input |
| L | L | L | H | ↑↓ | ↑↓ | DATA_out | Data Output |

Referring to Table 1, while the nonvolatile memory device 120 receives the command CMD or the address ADDR or makes input/output of the data "DATA", the chip enable signal /CE maintains a low level "L". During a command input mode Command Input, the memory controller 110 may control signal lines such that the command latch enable signal CLE has a high level "H", the address latch enable signal ALE has the low level "L", the write enable signal /WE toggles between the high level "H" and the low level "L", and the read enable signal /RE has the high level "H". During the command input mode Command Input, the memory controller 110 may transmit the command CMD to the nonvolatile memory device 120 through data signals DQx in synchronization with a rising edge (↑) of the write enable signal /WE. The nonvolatile memory device 120 may identify the command CMD from the data signals DQx in response to the rising edge (↑) of the write enable signal /WE.

During an address input mode Address Input, the memory controller 110 may control the signal lines such that the command latch enable signal CLE has the low level "L", the address latch enable signal ALE has the high level "H", the write enable signal /WE toggles between the high level "H" and the low level "L", and the read enable signal /RE has the high level "H". During the address input mode Address Input, the memory controller 110 may transmit the address ADDR to the nonvolatile memory device 120 through the data signals DQx in synchronization with a rising edge (↑) of the write enable signal /WE. The nonvolatile memory device 120 may identify the address ADDR from the data signals DQx in response to the rising edge (↑) of the write enable signal /WE.

During a data input mode Data Input, the memory controller 110 may control the signal lines such that the command latch enable signal CLE has the low level "L", the address latch enable signal ALE has the low level "L", the write enable signal /WE has the high level "H", the read enable signal /RE has the high level "H", and the data strobe signal DQS toggles between the high level "H" and the low level "L". During the data input mode Data Input, the memory controller 110 may transmit the data "DATA" to the nonvolatile memory device 120 through the data signals DQx in synchronization with a rising edge (↑) and a falling edge (↓) of the data strobe signal DQS. The nonvolatile memory device 120 may identify the data "DATA" from the data signals DQx in response to the rising edge (↑) and the falling edge (↓) of the data strobe signal DQS.

During a data output mode Data Output, the memory controller 110 may control the signal lines such that the command latch enable signal CLE has the low level "L", the address latch enable signal ALE has the low level "L", the write enable signal /WE has the high level "H", and the read enable signal /RE toggles between the high level "H" and the low level "L". During the data output mode Data Output, the nonvolatile memory device 120 may generate the data strobe signal DQS toggling between the high level "H" and the low level "L" in response to the read enable signal /RE. The nonvolatile memory device 120 may transmit the data "DATA" to the memory controller 110 through the data signals DQx in synchronization with a rising edge (↑) and a falling edge (↓) of the data strobe signal DQS. The memory controller 110 may identify the data "DATA" from the data signals DQx in response to the rising edge (↑) and the falling edge (↓) of the data strobe signal DQS.

The above toggle interface is an example, and the present disclosure is not limited thereto.

In an example embodiment, the memory controller 110 may include a read level manager 111. The read level manager 111 may be configured to manage a level of a read voltage that is used in a read operation of the nonvolatile memory device 120. For example, the nonvolatile memory device 120 may perform the read operation by using a plurality of read voltages. An error may occur at read data due to various factors. In this case, an error may be prevented from occurring by changing levels of the plurality of read voltages. The read level manager 111 may be configured to control levels of the plurality of read voltages, based on degradation information of memory cells included in the nonvolatile memory device 120. In an example embodiment, through a valley search operation, the read level manager 111 may search an optimal read level or control a plurality of read levels. An operation of the read level manager 111 will be described in more detail with reference to the following drawings.

Figure 2:
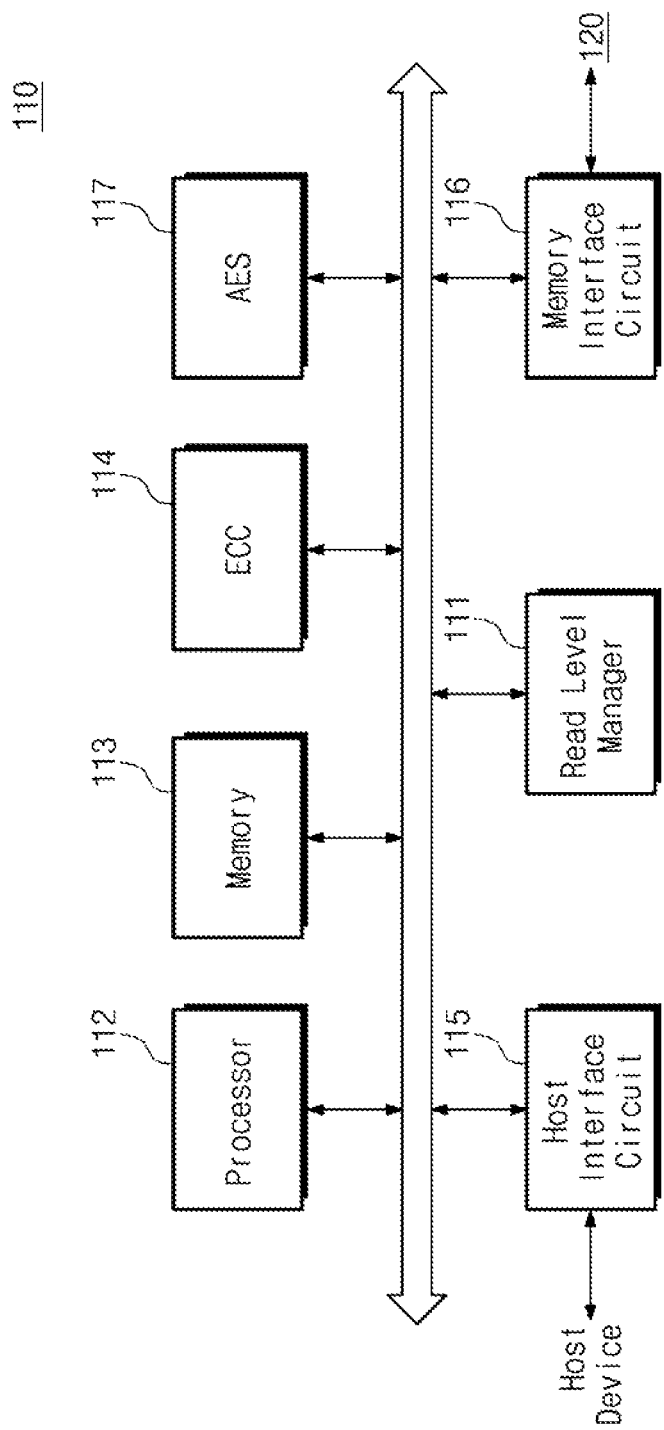
FIG. 2 is a block diagram illustrating a memory controller of FIG. 1.

FIG. 2 is a block diagram illustrating a memory controller of FIG. 1.

Referring to FIGS. 1 and 2, the memory controller 110 may include the read level manager 111, a processor 112, a memory 113, an error correction code (ECC) engine 114, a host interface circuit 115, a memory interface circuit 116, and an advanced encryption standard (AES) engine 117.

The read level manager 111 may be configured to search an optimal read voltage that is used in the nonvolatile memory device 120. The read level manager 111 may set operation parameters determined based on a degradation state of memory cells and may perform a valley search operation based on the operation parameters thus set. An operation of the read level manager 111 will be described in more detail with reference to the following drawings.

The processor 112 may control overall operations of the memory controller 110.

The memory 113 may be used as a buffer memory, a cache memory, or a working memory of the memory controller 110.

The ECC engine 114 may be configured to perform error detection and error correction on data read from the nonvolatile memory device 120. For example, the ECC engine 114 may generate parity bits for data to be written in the nonvolatile memory device 120. The parity bits may be stored in the nonvolatile memory device 120 together with the data. Afterwards, when the data are read from the nonvolatile memory device 120, the ECC engine 114 may detect an error of the read data based on the parity bits read from the nonvolatile memory device 120 together with the data, and may correct the detected error. In an example embodiment, the ECC engine 114 may have a given error correction capacity. In the case where the data read from the nonvolatile memory device 120 includes an error that exceeds the error correction capacity of the ECC engine 114, the ECC engine 114 may fail to correct the error of the read data. This data is called "UECC data", and the error of the data may be corrected through an error correction manner or a read manner, which is different from the error correction manner or the read manner described above. Below, the "UECC data" is referred to as "data" including an error uncorrectable by the ECC engine 114 of the memory controller 110.

The host interface circuit 115 may communicate with an external host device. For example, the host interface circuit 115 may be implemented based on various interface protocols such as ATA (Advanced Technology Attachment), SATA (Serial ATA), e-SATA (external SATA), SCSI (Small Computer Small Interface), SAS (Serial Attached SCSI), PCI (Peripheral Component Interconnection), PCIe (PCI express), NVMe (NVM express), IEEE 1394, USB (Universal Serial Bus), SD (Secure Digital) card, MMC (Multi-Media Card), eMMC (embedded Multi-Media Card), UFS (Universal Flash Storage), eUFS (embedded Universal Flash Storage), and CF (Compact Flash) card, etc.

The memory interface circuit 116 may provide the communication with the nonvolatile memory device 120. For example, the memory interface circuit 116 may be implemented based on the toggle interface described with reference to FIG. 1 or the open NAND flash interface (ONFI), but the present disclosure is not limited thereto.

The AES engine 117 may perform an encryption operation or a decryption operation on data received from the external host device or the nonvolatile memory device 120. In an example embodiment, the encryption operation or the decryption operation may be performed based on a symmetric-key algorithm.

Figure 3:
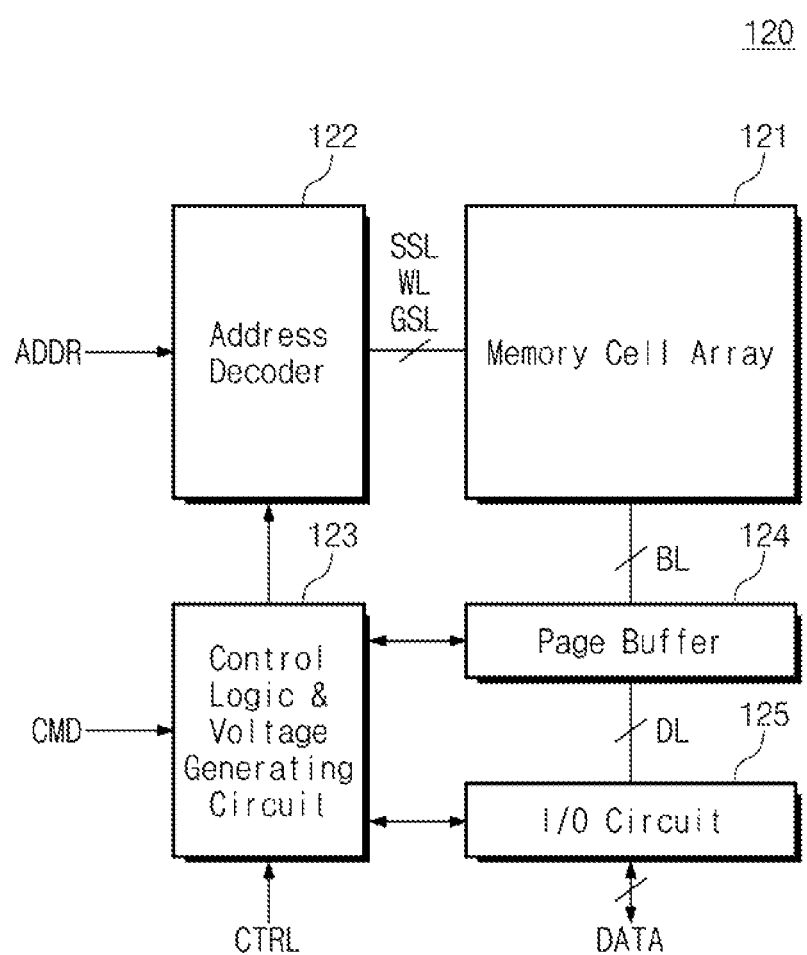
FIG. 3 is a block diagram illustrating a nonvolatile memory device of FIG. 1.

FIG. 3 is a block diagram illustrating a nonvolatile memory device of FIG. 1.

Referring to FIGS. 1 and 3, the nonvolatile memory device 120 may include a memory cell array 121, an address decoder 122, a control logic and voltage generating circuit 123, a page buffer 124, and an input/output circuit 125.

The memory cell array 121 may include a plurality of memory blocks. Each of the memory blocks may include a plurality of cell strings. Each of the plurality of cell strings may include a plurality of cell transistors connected in series. The plurality of cell transistors may be connected with string selection lines SSL, word lines WL, and ground selection lines GSL.

The address decoder 122 may be connected with the memory cell array 121 through the string selection lines SSL, the word lines WL, and the ground selection lines GSL. The address decoder 122 may decode the address ADDR received from the memory controller 110, and may control the string selection lines SSL, the word lines WL, and the ground selection lines GSL based on the decoded address.

The control logic and voltage generating circuit 123 (hereinafter referred to as a "control logic circuit") may control components of the nonvolatile memory device 120 in response to the command CMD and a control signal CTRL (e.g., /CE, CLE, ALE, /RE, and /WE) from the memory controller 110. The control logic circuit 123 may generate various voltages used for the nonvolatile memory device 120 to operate. For example, the control logic circuit 123 may generate various voltages such as a plurality of program voltages, a plurality of program verification voltages, a plurality of read voltages, a plurality of erase voltages, and a plurality of erase verification voltages. It is assumed for convenience of explanation that various voltages (e.g., a plurality of read voltages) to be described below are generated by the control logic circuit 123 and are provided to a corresponding word line through the address decoder 122. In an example embodiment, the plurality of read voltages may be variously changed under control of the memory controller 110.

The page buffer 124 may be connected with the memory cell array 121 through bit lines BL. The page buffer 124 may temporarily store data to be programmed in memory cells of the memory cell array 121 through the bit lines BL. In another implementation, the page buffer 124 may control levels of the bit lines BL based on data received from the input/output circuit 125 through data lines DL.

The input/output circuit 125 may receive data from the page buffer 124 through the data lines DL and may transfer the received data to the memory controller 110. In another implementation, the input/output circuit 125 may transfer data received from the memory controller 110 to the page buffer 124 through the data lines DL.

Figure 4:
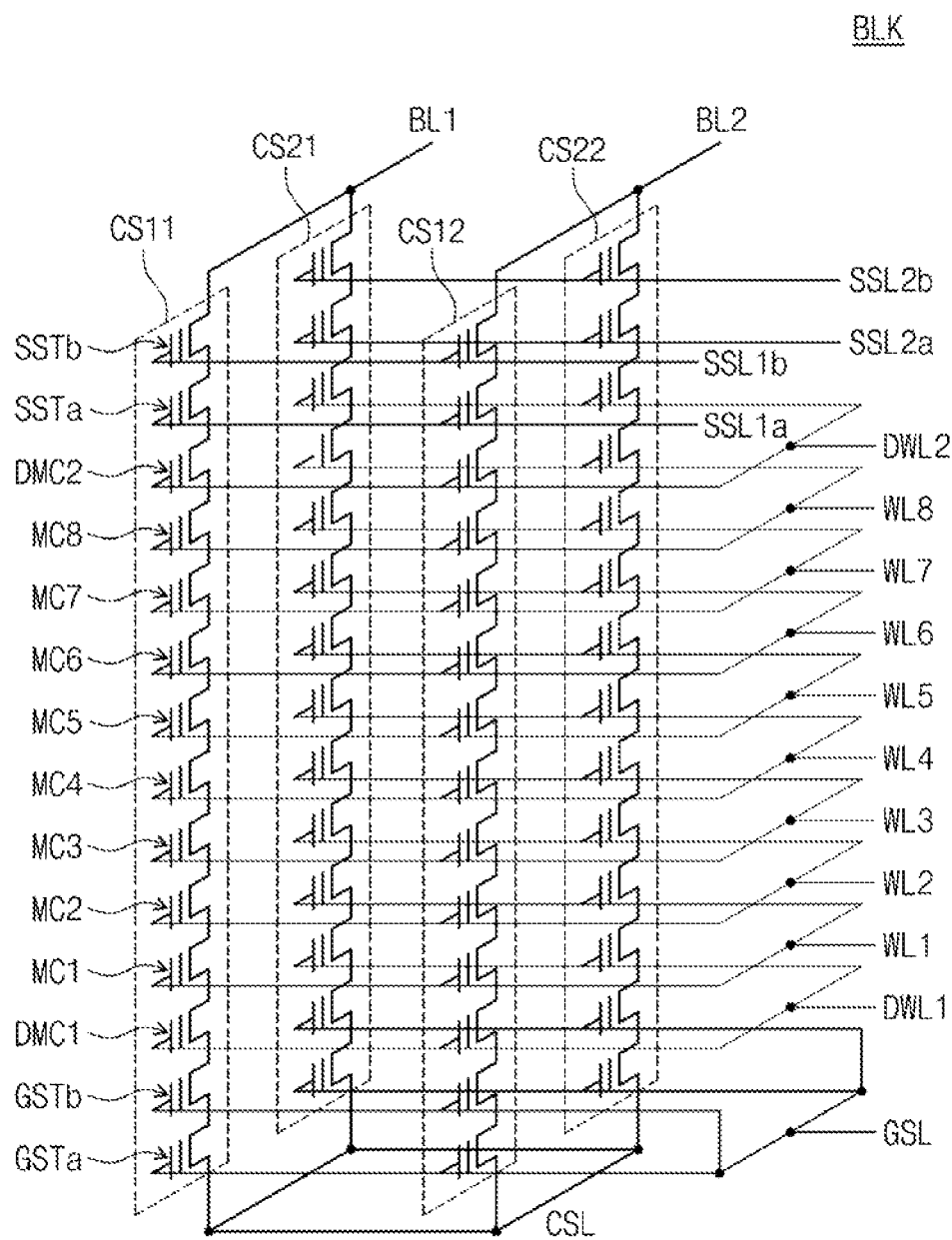
FIG. 4 is a circuit diagram illustrating one memory block of a plurality of memory blocks included in a memory cell array of FIG. 3.

FIG. 4 is a circuit diagram illustrating one memory block BLK of a plurality of memory blocks included in a memory cell array of FIG. 3. One memory block BLK will be described with reference to FIG. 4, but the present disclosure is not limited thereto. A plurality of memory blocks included in the memory cell array 121 may have a structure that is the same as or similar to the structure of the memory block BLK illustrated in FIG. 4.

Referring to FIGS. 3 and 4, the memory block BLK in the memory cell array 121 may include a plurality of cell strings CS11, CS12, CS21, and CS22. The plurality of cell strings CS11, CS12, CS21, and CS22 may be arranged in a row direction and a column direction.

Cell strings placed at the same column from among the plurality of cell strings CS11, CS12, CS21, and CS22 may be connected with the same bit line. For example, the cell strings CS11 and CS21 may be connected with a first bit line BL1, and the cell strings CS12 and CS22 may be connected with a second bit line BL2. Each of the plurality of cell strings CS11, CS12, CS21, and CS22 may include a plurality of cell transistors. Each of the plurality of cell transistors may include a charge trap flash (CTF) memory cell, but the present disclosure is not limited thereto. In each cell string, the plurality of cell transistors may be stacked in a height direction that is a direction perpendicular to a plane defined by the row direction and the column direction (e.g., to a semiconductor substrate (not illustrated)).

In each cell string, the plurality of cell transistors may be connected in series between a corresponding bit line (e.g., BL1 or BL2) and a common source line CSL. For example, in each cell string, the plurality of cell transistors may include string selection transistors SSTa and SSTb, dummy memory cells DMC1 and DMC2, memory cells MC1 to MC8, and ground selection transistors GSTa and GSTb. The string selection transistors SSTa and SSTb that are connected in series may be provided or connected between the serially-connected memory cells MC1 to MC8 and the corresponding bit line (e.g., BL1 and BL2). The ground selection transistors GSTa and GSTb that are connected in series may be provided or connected between the serially-connected memory cells MC1 to MC8 and the common source line CSL. In an example embodiment, the second dummy memory cell DMC2 may be provided between the serially-connected string selection transistors SSTa and SSTb and the serially-connected memory cells MC1 to MC8, and the first dummy memory cell DMC1 may be provided between the serially-connected memory cells MC1 to MC8 and the serially-connected ground selection transistors GSTa and GSTb.

In the plurality of cell strings CS11, CS12, CS21, and CS22, memory cells placed at the same height from among the memory cells MC1 to MC8 may share the same word line. For example, the first memory cells MC1 of the plurality of cell strings CS11, CS12, CS21, and CS22 may be placed at the same height from the substrate (not illustrated) and may share a first word line WL1. The second memory cells MC2 of the plurality of cell strings CS11, CS12, CS21, and CS22 may be placed at the same height from the substrate (not illustrated) and may share a second word line WL2. Likewise, the third to eighth memory cells MC3 to MC8 of the plurality of cell strings CS11, CS12, CS21, and CS22 may be placed at the same heights from the substrate and may share third to eighth word lines WL3 to WL8, respectively.

Dummy memory cells placed at the same height from among the dummy memory cells DMC1 and DMC2 of the plurality of cell strings CS11, CS12, CS21, and CS22 may share the same dummy word line. For example, the first dummy memory cells DMC1 of the plurality of cell strings CS11, CS12, CS21, and CS22 may share a first dummy word line DWL1, and the second dummy memory cells DMC2 of the plurality of cell strings CS11, CS12, CS21, and CS22 may share a second dummy word line DWL2.

String selection transistors placed at the same height and the same row from among the string selection transistors SSTa and SSTb of the plurality of cell strings CS11, CS12, CS21, and CS22 may share the same string selection line. For example, the string selection transistors SSTb of the cell strings CS11 and CS12 may be connected with a string selection line SSL1b, and the string selection transistors SSTa of the cell strings CS11 and CS12 may be connected with a string selection line SSL1a. The string selection transistors SSTb of the cell strings CS21 and CS22 may be connected with a string selection line SSL2b, and the string selection transistors SSTa of the cell strings CS21 and CS22 may be connected with a string selection line SSL2a.

Although not illustrated in FIG. 4, string selection transistors placed at the same row from among the string selection transistors SSTa and SSTb of the plurality of cell strings CS11, CS12, CS21, and CS22 may share the same string selection line. For example, the string selection transistors SSTb and SSTa of the cell strings CS11 and CS12 may share a first string selection line, and the string selection transistors SSTb and SSTa of the cell strings CS21 and CS22 may share a second string selection line different from the first string selection line.

Ground selection transistors placed at the same height and the same row from among the ground selection transistors GSTa and GSTb of the plurality of cell strings CS11, CS12, CS21, and CS22 may share the same ground selection line. Although not illustrated in FIG. 4, the ground selection transistors GSTb of the cell strings CS11 and CS12 may be connected with a first ground selection line, and the ground selection transistors GSTa of the cell strings CS11 and CS12 may be connected with a second ground selection line. The ground selection transistors GSTb of the cell strings CS21 and CS22 may be connected with a third ground selection line, and the ground selection transistors GSTa of the cell strings CS21 and CS22 may be connected with a fourth ground selection line.

Referring to FIG. 4, the ground selection transistors GSTb and GSTa of the plurality of cell strings CS11, CS12, CS21, and CS22 may share the same ground selection line GSL. In another implementation, ground selection transistors placed at the same height from among the ground selection transistors GSTb and GSTa of the plurality of cell strings CS11, CS12, CS21, and CS22 may share the same ground selection line. In another implementation, ground selection transistors placed at the same height from among the ground selection transistors GSTb and GSTa of the plurality of cell strings CS11, CS12, CS21, and CS22 may share the same ground selection line.

In an example embodiment, although not illustrated in FIG. 4, each of the plurality of cell strings CS11, CS12, CS21, and CS22 of the memory block BLK may further include an erase control transistor (ECT). The erase control transistors of the plurality of cell strings CS11, CS12, CS21, and CS22 may be placed at the same height from the substrate and may be connected with the same erase control line (ECL). For example, in each of the plurality of cell strings CS11, CS12, CS21, and CS22, the erase control transistor may be interposed between the ground selection transistor GSTa and the common source line CSL. In another implementation, in each of the plurality of cell strings CS11, CS12, CS21, and CS22, the erase control transistor may be interposed between the corresponding bit line BL1 or BL2 and the string selection transistor SSTb. However, the present disclosure is not limited thereto.

The memory block BLK illustrated in FIG. 4 is an example, and the number of cell strings may increase or decrease, and the number of rows of cell strings and the number of columns of cell strings may increase or decrease depending on the change in the number of cell strings. Also, the number of cell transistors (e.g., GST, MC, DMC, and SST) in the memory block BLK may increase or decrease, and the height of the memory block BLK may increase or decrease depending on the number of cell transistors (e.g., GST, MC, DMC, and SST). In addition, depending on the number of cell transistors, the number of lines (e.g., GSL, WL, DWL, and SSL) connected with the cell transistors may increase or decrease.

Figure 5:
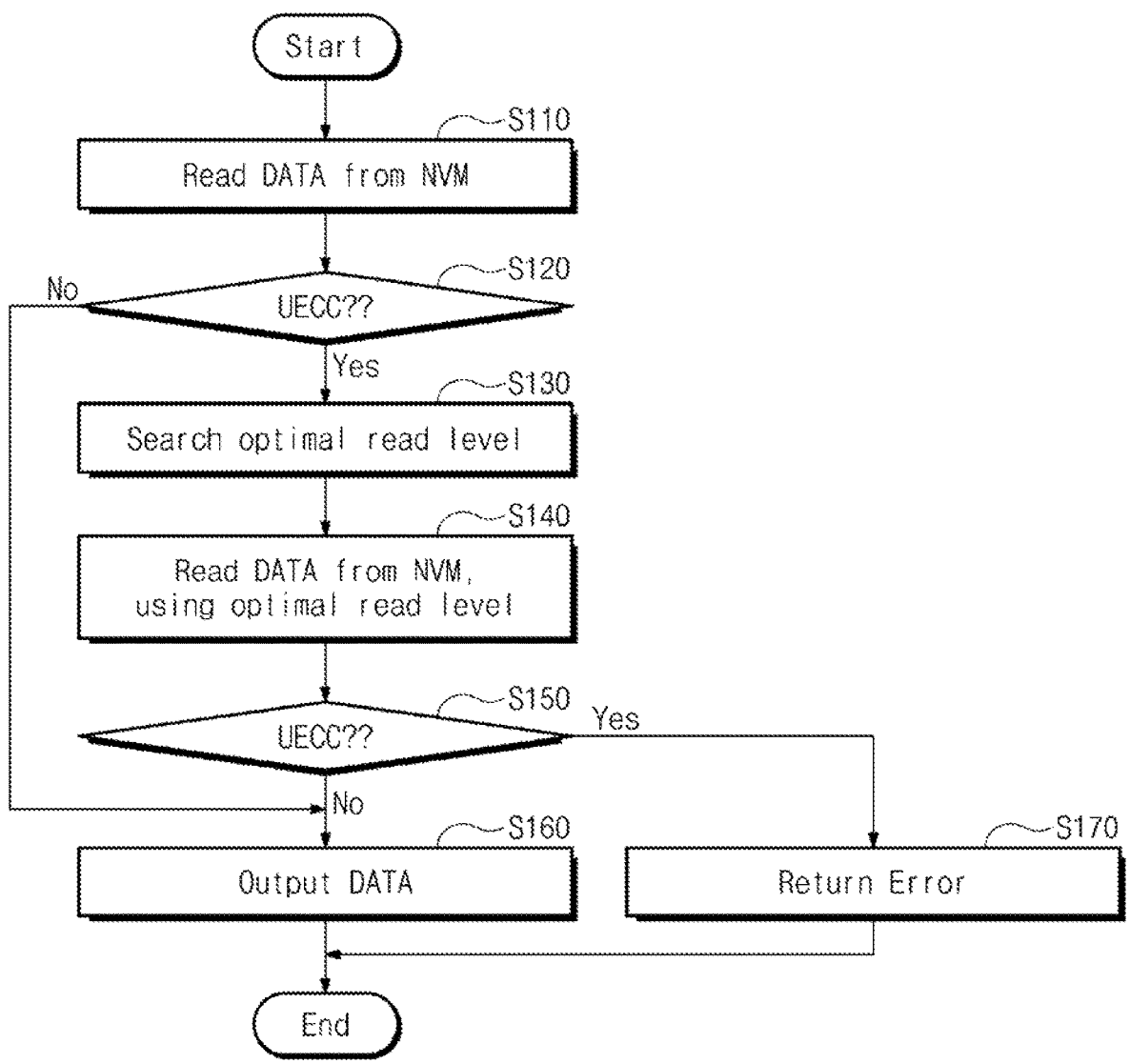
FIG. 5 is a flowchart illustrating an operation method of a memory controller of FIG. 1.

FIG. 5 is a flowchart illustrating an operation method of a memory controller of FIG. 1. As an example, a read operation of the memory controller 110 will be described with reference to FIG. 5.

Referring to FIGS. 1, 2, and 5, in operation S110, the memory controller 110 may read the data "DATA" from the nonvolatile memory device 120. For example, the memory controller 110 may transmit a read command and an address to the nonvolatile memory device 120. In response to the read command, the nonvolatile memory device 120 may read the data "DATA" from memory cells corresponding to the address and may transfer the data "DATA" to the memory controller 110.

In operation S120, the memory controller 110 may determine whether the read data are the UECC data. For example, as described with reference to FIG. 2, the ECC engine 114 of the memory controller 110 may detect and correct an error of read data. When the error is not corrected by the ECC engine 114, the memory controller 110 may determine that the UECC data occur (Yes).

When it is determined that the UECC data occur, in operation S130, the memory controller 110 may search an optimal read level. For example, the read level manager 111 of the memory controller 110 may perform a valley search operation based on a degradation state of memory cells. The read level manager 111 may search an optimal read level through the valley search operation. An operation of the read level manager 111 will be described in more detail with reference to the following drawings.

In operation S140, the memory controller 110 may again read the data "DATA" from the nonvolatile memory device 120 by using the found optimal read level.

In operation S150, the memory controller 110 may determine whether the UECC data occur. For example, the ECC engine 114 of the memory controller 110 may perform an error correction operation on the data "DATA" read by using the optimal read level. When an error is not corrected by the ECC engine 114, the memory controller 110 may determine that the UECC data occur (Yes).

When it is determined in operation S120 or operation S150 that the UECC data do not occur (No) (i.e., when an error is corrected by the ECC engine 114), in operation S160, the memory controller 110 may output data. For example, the memory controller 110 may transmit error-corrected data to the external host device. In an example embodiment, the memory controller 110 may use the error-corrected data in any other operation (e.g., a garbage collection operation or a read reclaim operation).

When it is determined in operation S150 that the UECC data occur (Yes), in operation S170, the memory controller 110 may return an error. For example, the memory controller 110 may notify the external host device that an error is present in the read-requested data.

Figure 6:
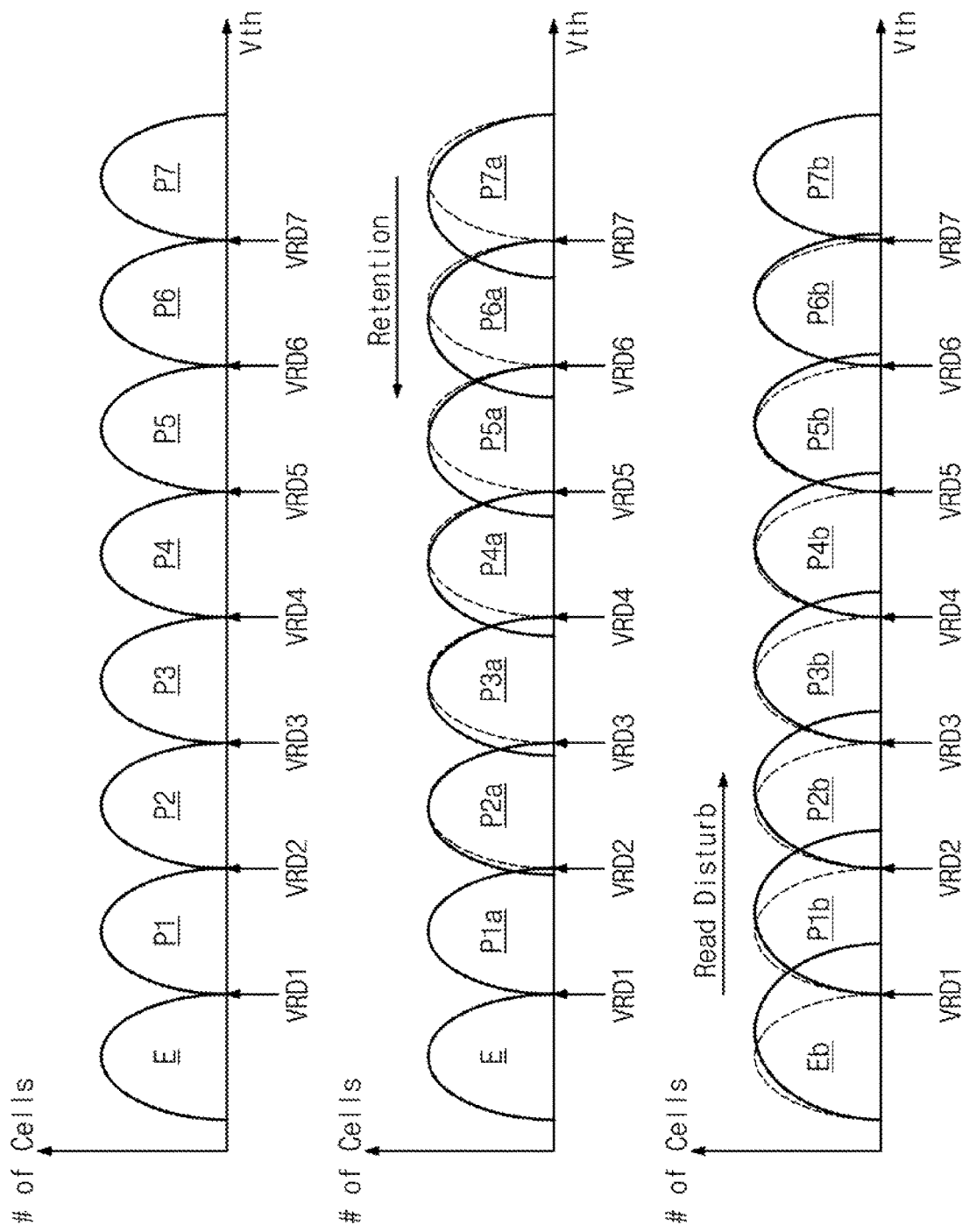
FIG. 6 illustrates threshold voltage distribution diagrams for memory cells of a nonvolatile memory device of FIG. 1.

FIG. 6 illustrates threshold voltage distribution diagrams for memory cells of a nonvolatile memory device of FIG. 1. In the distribution diagrams of FIG. 6, a horizontal axis represents a threshold voltage of a memory cell, and a vertical axis represents the number of memory cells. Kinds of errors that occur at the nonvolatile memory device 120 will be described with reference to FIG. 6. For convenience of description, it is assumed for convenience of explanation that each memory cell is a triple level cell (TLC) to store 3-bit data. However, the present disclosure is not limited thereto. For example, memory cells may be memory cells such as a single level cell (SLC), a multi-level cell (MLC), and a quadruple level cell (QLC).

Referring to FIGS. 1, 4, and 6, each of memory cells of the nonvolatile memory device 120 may have one of an erase state "E" and first to seventh program states P1 to P7. The nonvolatile memory device 120 may determine states of memory cells by using first to seventh read voltages VRD1 to VRD7 and may identify data stored in the memory cells based on a determination result.

In an example embodiment, threshold voltages of memory cells may change due to various factors. For example, "retention degradation" or "charge loss" may occur at memory cells. The "retention degradation" or "charge loss" may indicate a degradation characteristic that threshold voltages of memory cells decrease. The "retention degradation" or "charge loss" may occur over time from a time when memory cells are programmed. In the case where threshold voltages of memory cells decrease, each of the memory cells may have one of the erase state "E" and program states P1a to P7a. Referring to FIG. 6, the program states P1a to P7a have a characteristic that threshold voltages decrease on the whole compared to the first to seventh program states P1 to P7.

"Read disturb" or "charge gain" may occur at memory cells. The "read disturb" or "charge gain" may indicate a degradation characteristic that threshold voltages of memory cells increase. The "read disturb" or "charge gain" may occur due to read operations repeatedly performed on memory cells or peripheral memory cells. In the case where threshold voltages of memory cells increase, each of the memory cells may have one of the erase state "E" and program states P1b to P7b. Referring to FIG. 6, the program states P1b to P7b have a characteristic that threshold voltages increase on the whole compared to the first to seventh program states P1 to P7.

Below, for convenience of description, program states of memory cells where degradation does not occur are respectively referred to as the "first to seventh program states P1 to P7", the program states P1a to P7a of memory cells where retention degradation occurs are respectively referred to as "first to seventh charge loss states", and the program states P1b to P7b of memory cells where read disturb degradation occurs are respectively referred to as "first to seventh charge gain states" This is only a shorthand, and it may be understood that the present disclosure is not limited by the above terms.

In programmed memory cells, in the case where a threshold voltage increases or a threshold voltage decreases, an error may occur at data read from the memory cells. For example, referring to FIG. 6, the program states P1a to P7a of memory cells where the retention degradation occurs may not be normally read by the first to seventh read voltages VRD1 to VRD7. Likewise, the program states P1b to P7b of memory cells where the read disturb occurs may not be normally read by the first to seventh read voltages VRD1 to VRD7.

Thus, in memory cells, in the case where the retention degradation or the read disturb occurs, an operation of controlling a read level or searching an optimal read level may be performed.

For convenience of description, two kinds of degradation, e.g., retention degradation and read degradation are described above, but the present disclosure is not limited thereto. For example, various types of degradation may occur. For example, the charge loss and the charge gain may simultaneously occur at a selected memory cell. In this case, because a magnitude by which a threshold voltage of a memory cell is increased/decreased may be variously changed depending on the degree of charge loss and the degree of charge gain, a threshold voltage distribution of memory cells may be changed to various shapes.

Figure 7:
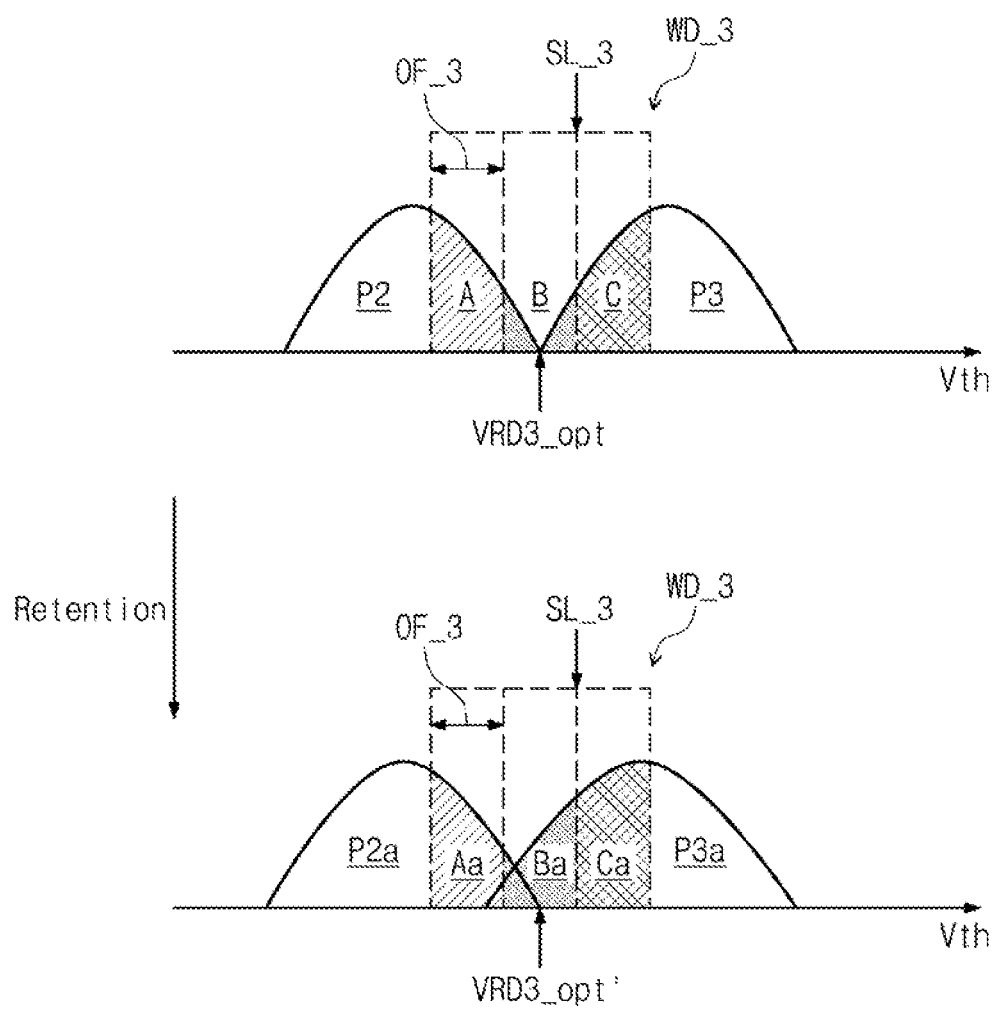
FIG. 7 is a diagram for describing a valley search operation of searching an optimal read level.

FIG. 7 is a diagram for describing a valley search operation of searching an optimal read level. For convenience of description, an operation for searching a valley between the second and third program states P2 and P3 of memory cells will be described. However, the present disclosure is not limited thereto. For example, the valley search operation illustrated in FIG. 7 may be applied to search a valley between adjacent program states. For convenience of description, below, it is assumed that the read operation or the valley search operation is performed on memory cells connected with a selected word line.

Referring to FIGS. 1, 6, and 7, the memory controller 110 may perform the valley search operation for the purpose of searching the valley between the second and third program states P2 and P3 of memory cells in the nonvolatile memory device 120.

The memory controller 110 may perform cell-counting on selected memory cells connected with the selected word line by using a plurality of search levels included in a third window WD_3. In an example embodiment, the number of search levels may be "4".

For example, the third window WD_3 may be determined based on a third starting level SL_3 and a third offset OF_3. The third starting level SL_3 may indicate a starting level at which the valley search operation is performed on the second and third program states P2 and P3, and the third offset OF_3 may indicate a distance between search levels included in the third window WD_3.

In detail, the memory controller 110 may perform cell-counting on the memory cells connected with the selected word line by using a level (i.e., SL_3−2×OF_3) smaller than the third starting level SL_3 as much as two times the third offset OF_3. The memory controller 110 may perform cell-counting on the memory cells connected with the selected word line by using a level (i.e., SL_3−OF_3) smaller than the third starting level SL_3 as much as the third offset OF_3. The memory controller 110 may perform cell-counting on the memory cells connected with the selected word line by using the third starting level SL_3. The memory controller 110 may perform cell-counting on the memory cells connected with the selected word line by using a level (i.e., SL_3+OF_3) greater than the third starting level SL_3 as much as the third offset OF_3. Thus, the memory controller 110 may perform cell-counting on the selected memory cells four times by using the levels [SL_3−2×OF_3], [SL_3−OF_3], [SL_3], and [SL_3+OF_3].

In an example embodiment, a location of the third starting level SL_3 may be variously changed. For example, the third starting level SL_3 may be the smallest level or the greatest level of the plurality of search levels included in the third window WD_3. In another implementation, the third starting level SL_3 may be any one of the plurality of search levels included in the third window WD_3.

The memory controller 110 may detect the number of memory cells included in a first area "A", the number of memory cells included in a second area "B", and the number of memory cells included in a third area "C", based on results of the cell-counting. The memory controller 110 may determine an optimal level VRD3_opt of a third read voltage based on the numbers of memory cells associated with the first to third areas "A", "B", and "C". For example, the read level manager 111 of the memory controller 110 may model a second-order function based on the numbers of memory cells associated with the first to third areas "A", "B", and "C", and may search a valley of the second-order function thus modeled. The found valley may be determined as the optimal level VRD3_opt of the third read voltage.

In an example embodiment, as described with reference to FIG. 6, in the case where degradation occurs at memory cells, an optimal read level may not be normally found. For example, in the case where the retention degradation occurs at memory cells, the memory cells may have the second and third charge loss states P2a and P3a. In the case where the valley search operation is performed based on search levels included in the third window WD_3 that is based on the third starting level SL_3 and the third offset OF_3, the numbers of memory cells obtained from the first to third areas "A", "B", and "C" may be Aa, Ba, and Ca, respectively. A level that is found based on values of Aa, Ba, and Ca may be VRD3_opt'. However, referring to FIG. 7, the level VRD3_opt' may not be an optimal read level corresponding to a valley of the second and third charge loss states P2a and P3a. Thus, in the case where degradation occurs at memory cells, an optimal read level may not be normally found. Thus, in the case where the valley search operation is performed without consideration of a degradation state of memory cells, an optimal read level may not be normally found.

Figure 8:
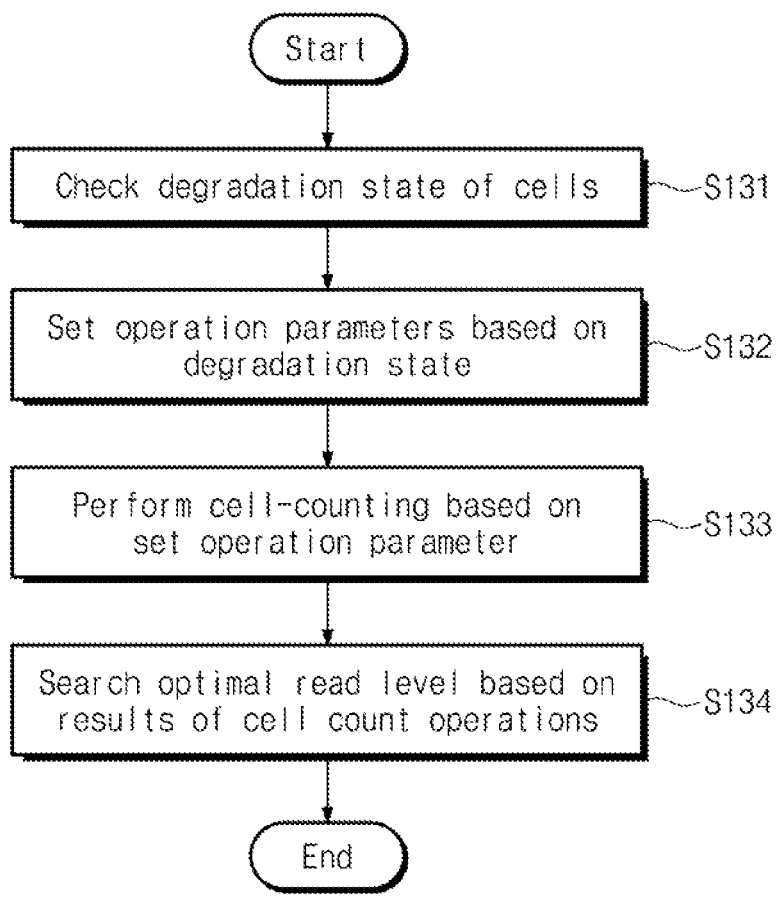
FIG. 8 is a flowchart illustrating an operation of a memory controller of FIG. 1.

FIG. 8 is a flowchart illustrating an operation of a memory controller of FIG. 1. Operation S130 of FIG. 5, e.g., the valley search operation, will be described in detail with reference to FIG. 8.

Referring to FIGS. 1, 6, and 8, in operation S131, the memory controller 110 may check a degradation state of memory cells. For example, the memory controller 110 may perform a counting operation on selected memory cells by using at least one cell-counting level, and may determine a degradation state of the memory cells based on a result of the counting operation. In another implementation, the memory controller 110 may determine a degradation state of memory cells based on various information such as a read count, an erase count, a program state, and a cell type associated with a selected word line.

In operation S132, the memory controller 110 may set operation parameters for the valley search operation based on the degradation state. The operation parameters may include a starting level and an offset that are used in the valley search operation. In an example embodiment, the starting level and the offset may be differently set depending on each program state of memory cells. The operation for setting the operation parameters will be described in more detail with reference to the following drawings.

In an example embodiment, operation S131 and operation S132 may be performed by the read level manager 111 of the memory controller 110. The read level manager 111 may be a hardware accelerator configured to perform machine learning that is based on operation S131 and operation S132.

In operation S133, the memory controller 110 may perform cell-counting based on the operation parameters thus set. For example, as described with reference to FIG. 7, the memory controller 110 may perform the cell-counting operation on selected memory cells based on the operation parameters (i.e., the starting level and the offset) set in operation S132. In an example embodiment, to search one optimal read level, the memory controller 110 may perform the cell-counting operation four times.

In operation S134, the memory controller 110 may search an optimal read level based on results of the cell-counting operations. For example, the memory controller 110 may search an optimal read level based on the method described with reference to FIG. 7.

Figure 9A:
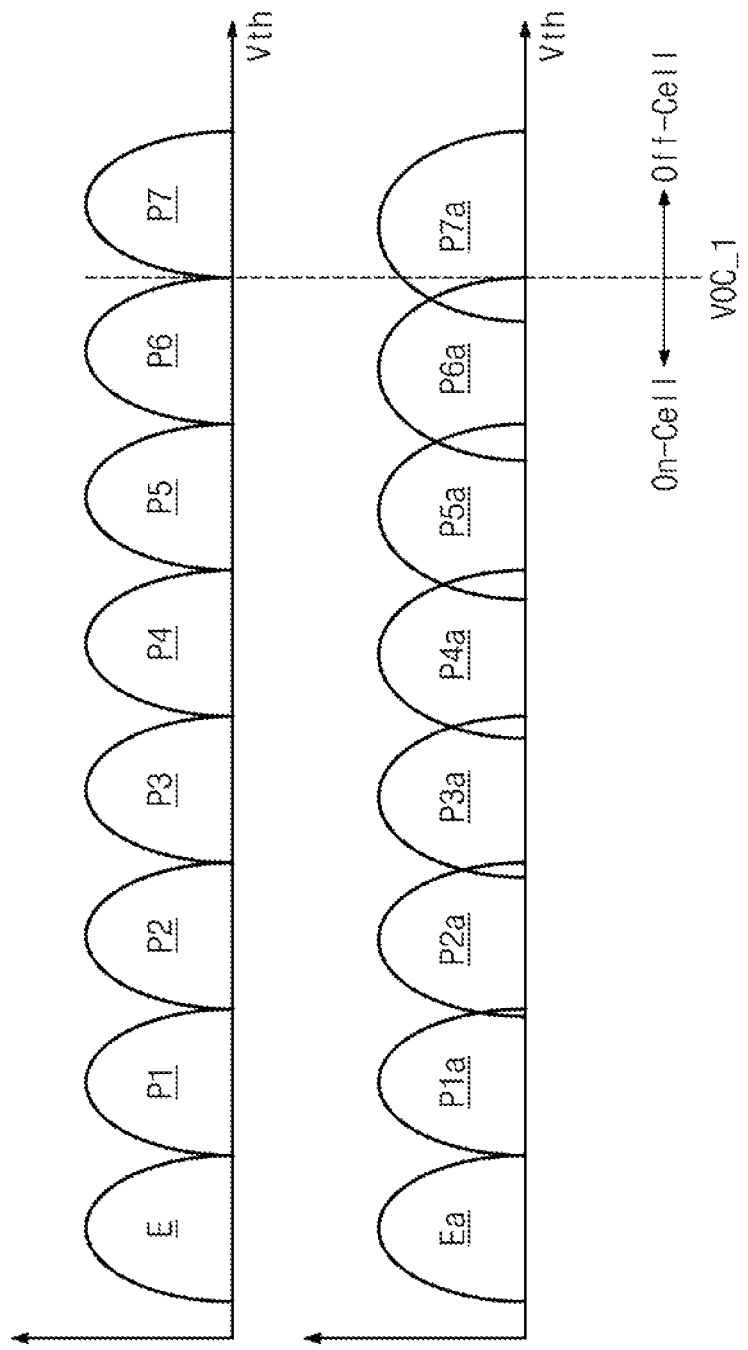

FIGS. 9A and 9B are diagrams for describing operation S131 of FIG. 8. A configuration for determining a degradation characteristic through the cell-counting operation will be described with reference to FIGS. 9A and 9B, but the present disclosure is not limited thereto. For example, the memory controller 110 may determine a degradation characteristic of selected memory cells based on a result of the cell-counting operation, a physical location of the selected memory cells, a type of the selected memory cells, a read count of the selected memory cells, an erase count of the selected memory cells, etc.

First, referring to FIG. 9A, the memory controller 110 may read the selected memory cells by using a first cell-counting voltage VOC_1. The first cell-counting voltage VOC_1 may be a voltage for reading the sixth and seventh program states P6 and P7. However, the present disclosure is not limited thereto. For example, the first cell-counting voltage VOC_1 may be variously changed or modified.

When degradation does not occur at the selected memory cells, e.g., when each of the selected memory cells has one of the erase state "E" and the first to seventh program states P1 to P7, the number of memory cells determined as an on-cell by the first cell-counting voltage VOC_1 may be the number of memory cells corresponding to the erase state "E" and the first to sixth program states P1 to P6, and the number of memory cells determined as an off-cell by the first cell-counting voltage VOC_1 may be the number of memory cells corresponding to the seventh program state P7.

In the selected memory cells, in the case where degradation (e.g., retention degradation or charge loss) occurs, e.g., in the case where each of the selected memory cells has an erase state Ea or any one of the first to seventh charge loss states P1a to P7a, the number of memory cells determined as an on-cell or an off-cell by the first cell-counting voltage VOC_1 may change. For example, compared to a normal state, in the case where the charge loss occurs at the selected memory cells, the number of off-cells determined by the first cell-counting voltage VOC_1 may decrease, and the number of on-cells determined by the first cell-counting voltage VOC_1 may increase.

Next, referring to FIG. 9B, the memory controller 110 may read the selected memory cells by using a second cell-counting voltage VOC_2. The second cell-counting voltage VOC_2 may be a voltage for reading the erase state "E" and the first program state P1. However, the present disclosure is not limited thereto. For example, the second cell-counting voltage VOC_2 may be variously changed or modified.

When degradation does not occur at the selected memory cells, e.g., when each of the selected memory cells has one of the erase state "E" and the first to seventh program states P1 to P7, the number of memory cells determined as an on-cell by the second cell-counting voltage VOC_2 may be the number of memory cells corresponding to the erase state "E", and the number of memory cells determined as an off-cell by the second cell-counting voltage VOC_2 may be the number of memory cells corresponding to the first to seventh program states P1 to P7.

In the selected memory cells, in the case where degradation (e.g., read disturb degradation or charge gain) occurs, e.g., in the case where each of the selected memory cells has an erase state Eb or any one of the first to seventh charge gain states P1b to P7b, the number of memory cells determined as an on-cell or an off-cell by the second cell-counting voltage VOC_2 may change. For example, compared to the normal state, in the case where the charge gain occurs at the selected memory cells, the number of off-cells determined by the second cell-counting voltage VOC_2 may increase, and the number of on-cells determined by the second cell-counting voltage VOC_2 may decrease.

As described above, a degradation state of the selected memory cells may be determined based on the number of on-cells and the number of off-cells (or referred to as an "on-cell count" and an "off-cell count") obtained through various cell-counting voltages. In an example embodiment, the degree or intensity of degradation of the selected memory cells may be determined based on the variance of the number of on-cells or the variance of the number of off-cells obtained through various cell-counting voltages (i.e., a difference with the normal state).

For example, it is assumed for convenience of explanation that when the selected memory cells are in the normal state, the number of off-cells read by the first cell-counting voltage VOC_1 is "100". In the case where the charge loss of a first intensity occurs at the selected memory cells, the number of off-cells read by the first cell-counting voltage VOC_1 may be "80"; in the case where the charge loss of a second intensity occurs at the selected memory cells, the number of off-cells read by the first cell-counting voltage VOC_1 may be "50". In this case, compared to the charge loss of the first intensity, the charge loss of the second intensity may be determined as having the larger degree of degradation. Thus, in the case where the charge loss of the second intensity occurs, threshold voltages of memory cells may decrease relatively more. As a result, as the variance of the number of on-cells or the variance of the number of off-cells obtained through various cell-counting voltages (i.e., a difference with the normal state) increases, the memory controller 110 may determine that the degree of degradation of the selected memory cells is high.

As an example, the first and second cell-counting voltages VOC_1 and VOC_2 are described with reference to FIGS. 9A and 9B, but the present disclosure is not limited thereto. Also, a configuration where a degradation state (i.e., retention degradation or read disturb degradation) of memory cells is determined depending on a result of a cell-counting operation (i.e., a decrease/increase of an on-cell count or a decrease/increase of an off-cell count) is described by ways of example, but the present disclosure is not limited thereto.

Figure 10A:
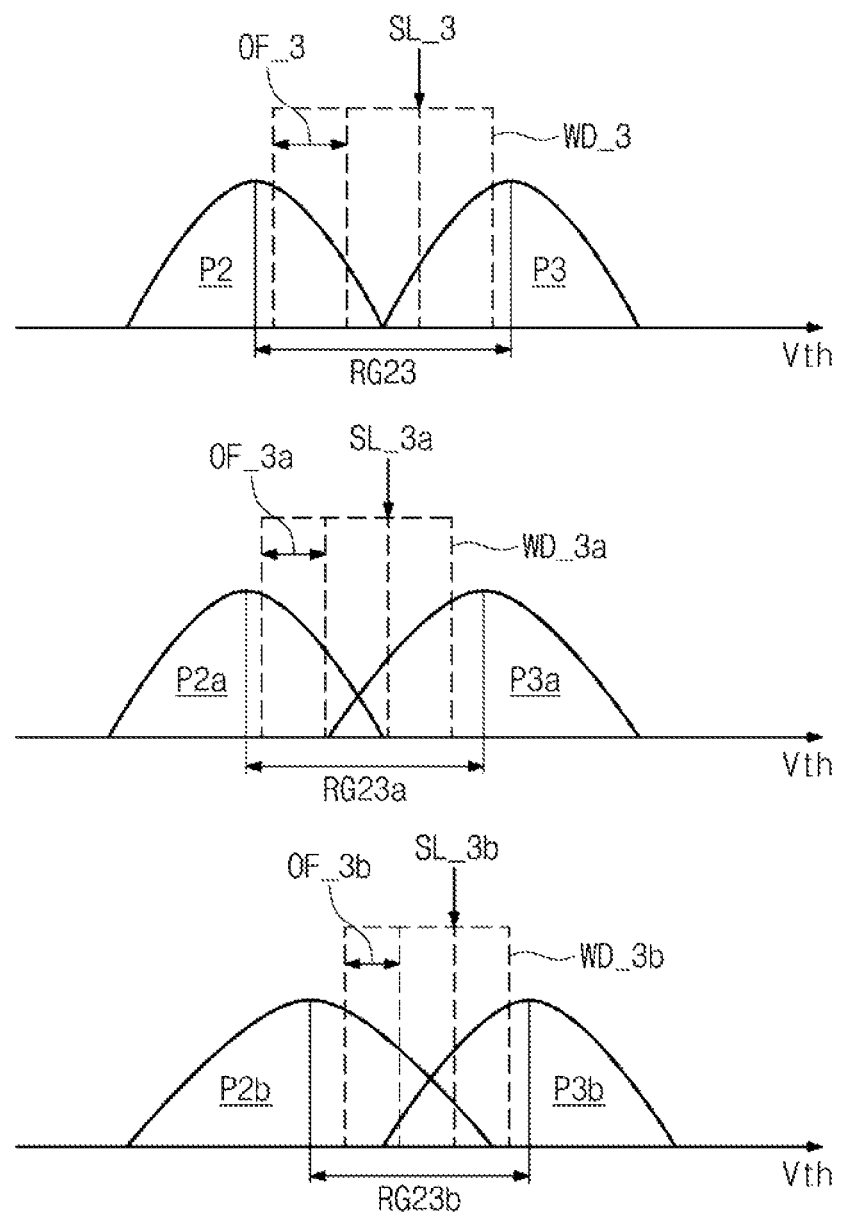
FIGS. 10A and 10B are diagrams for describing operation S132 of FIG. 8.
Figure 10B:
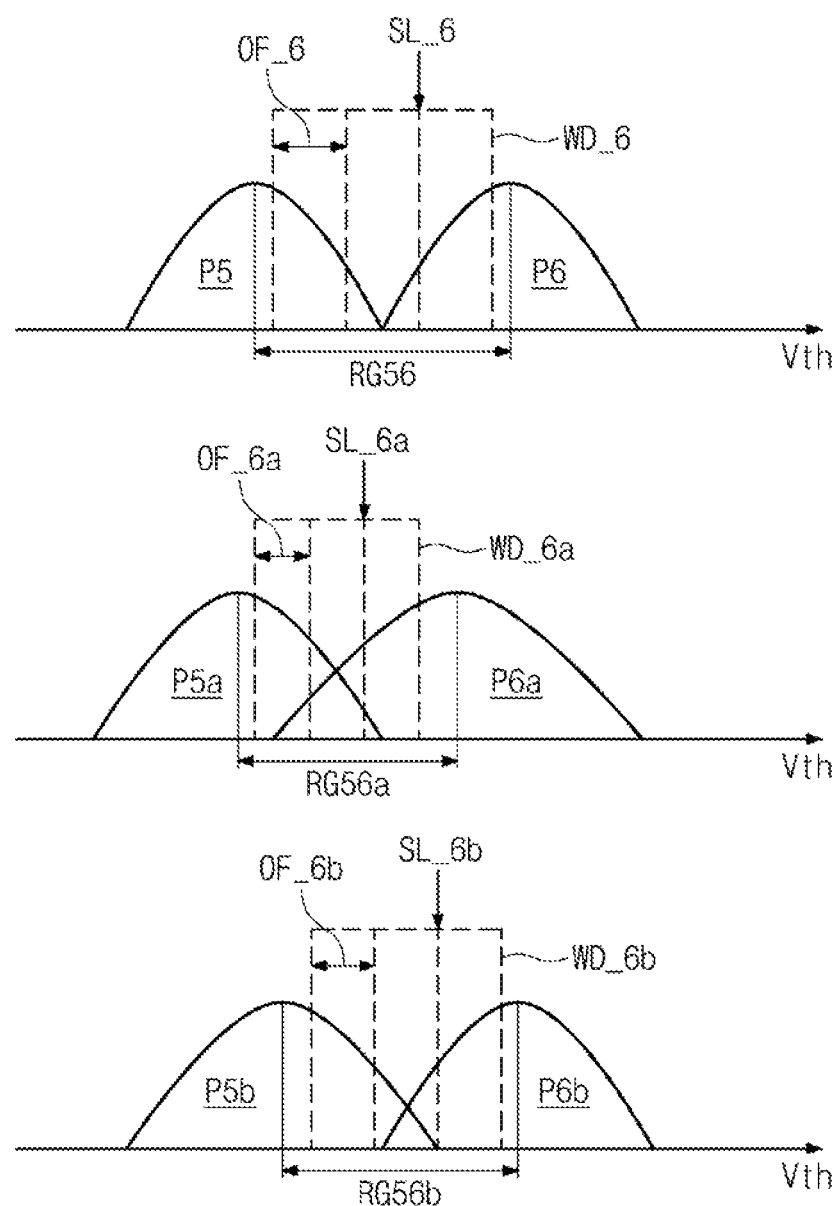

FIGS. 10A and 10B are diagrams for describing operation S132 of FIG. 8, e.g., an operation of setting operation parameters. Below, for convenience of description, the valley search operation is as described above, and thus, additional description will be omitted to avoid redundancy. An operation of setting operation parameters for the valley search operation based on a degradation state and a program state of selected memory cells will be described in detail with reference to FIGS. 10A an 10B. The memory controller 110 may set operation parameters based on a manner to be described with reference to FIGS. 10A and 10B, and may perform the valley search operation based on the operation parameters, as described with reference to FIG. 7.

Referring to FIGS. 1, 8, and 10A, the memory controller 110 may search a valley (i.e., an optimal read level) between the second and third program states P2 and P3. In this case, the memory controller 110 may perform the valley search operation in the third window WD_3. The third window WD_3 may be determined based on the operation parameters set by the memory controller 110, e.g., based on the third starting level SL_3 and the third offset OF_3. The valley search operation associated with the second and third program states P2 and P3 is described with reference to FIG. 7, and thus, additional description will be omitted to avoid redundancy.

In an example embodiment, the charge loss may occur at the selected memory cells, and the selected memory cells may have the second and third charge loss states P2a and P3a. In this case, as described with reference to FIG. 7, in the case where the valley search operation is performed in the third window WD_3, an optimal read level may not be normally read.

The memory controller 110 may detect that the charge loss occurs at the selected memory cells, by using the method described with reference to FIGS. 9A and 9B. The memory controller 110 may again set the third window WD_3 to a third charge loss window WD_3a, based on the occurrence of the charge loss. The third charge loss window WD_3a may be set by adjusting the operation parameters (i.e., a starting level and an offset) to a third charge loss starting level SL_3a and a third charge loss offset OF_3a, respectively. The memory controller 110 may perform the valley search operation in the third charge loss window WD_3a. In this case, a valley between the second and third charge loss states P2a and P3a, e.g., an optimal read level may be normally searched.

In an example embodiment, in the case where the charge loss occurs because threshold voltages of the selected memory cells decrease on the whole, a starting level may become relatively low. Thus, the third charge loss starting level SL_3a may be lower than the third starting level SL_3. In the case where the charge loss occurs, a distance between adjacent program states (e.g., a distance between crests of adjacent program states in a threshold voltage distribution) may become relatively narrow. For example, in memory cells of a normal state, a distance between crests of the second and third program states P2 and P3 may be "RG23". On the other hand, in memory cells experiencing the charge loss, a distance between crests of the second and third charge loss states P2a and P3a may be "RG23a". As a distance between adjacent program states becomes narrower, an offset may become relatively smaller. Thus, the third charge loss offset OF_3a may be smaller than the third offset OF_3.

The memory controller 110 may detect that the charge gain occurs at the selected memory cells, by using the method described with reference to FIGS. 9A and 9B. The memory controller 110 may again set the third window WD_3 to a third charge gain window WD_3b, based on that the charge gain occurs. The third charge gain window WD_3b may be set by adjusting the operation parameters (i.e., a starting level and an offset) to a third charge gain starting level SL_3b and a third charge gain offset OF_3b, respectively. The memory controller 110 may perform the valley search operation in the third charge gain window WD_3b thus set. In this case, a valley between the second and third charge gain states P2b and P3b, e.g., an optimal read level may be normally searched.

In an example embodiment, in the case where the charge gain occurs because threshold voltages of the selected memory cells increase on the whole, a starting level may become relatively high. Thus, the third charge gain starting level SL_3b may be higher than the third starting level SL_3. In the case where the charge gain occurs, a distance between adjacent program states (e.g., a distance between crests of adjacent program states in a threshold voltage distribution) may become relatively narrow. For example, a distance RG23b between crests of the second and third charge gain states P2b and P3b of memory cells experiencing the charge gain may be narrower than the distance RG23 between the crests of the second and third program states P2 and P3 of memory cells in a normal state. As a distance between adjacent program states becomes narrower, an offset may become relatively smaller. Thus, the third charge gain offset OF_3b may be smaller than the third offset OF_3.

In an example embodiment, the charge gain may occur strongly in a relatively low program state, and the charge loss may occur strongly in a relatively high program state. Thus, the intensity of charge gain occurring in the second and third program states P2 and P3 may be smaller than the intensity of charge loss occurring in the second and third program states P2 and P3. This may mean that the distance RG23b between the second and third charge gain states P2b and P3b is narrower than the distance RG23a between the second and third charge loss states P2a and P3a. To detect an optimal read level normally, as a distance between adjacent program states decreases, a window for the valley search operation becomes narrower. Accordingly, in the case of the embodiment illustrated in FIG. 10A, the third charge gain offset OF_3b may be smaller than the third charge loss offset OF_3a.

Next, referring to FIGS. 1, 8, and 10B, the memory controller 110 may perform the valley search operation on the fifth and sixth program states P5 and P6, in a sixth window WD_6. The sixth window WD_6 may be determined based on a sixth starting level SL_6 and a sixth offset OF_6.

As in the above description, in the case where the charge loss occurs at the selected memory cells, the selected memory cells may have the fifth and sixth charge loss states P5a and P6a. The memory controller 110 may perform the valley search operation in a sixth charge loss window WD_6a to search an optimal read level. The sixth charge loss window WD_6a may be determined based on a sixth charge loss starting level SL_6a and a sixth charge loss offset OF_6a.

Likewise, in the case where the charge gain occurs at the selected memory cells, the selected memory cells may have the fifth and sixth charge gain states P5b and P6b. The memory controller 110 may perform the valley search operation in a sixth charge gain window WD_6b to search an optimal read level. The sixth charge gain window WD_6b may be determined based on a sixth charge gain starting level SL_6b and a sixth charge gain offset OF_6b.

As in the case of FIG. 10A, in the case where the charge loss occurs because threshold voltages of the selected memory cells decrease on the whole, the memory controller 110 may set the sixth charge loss starting level SL_6a to be relatively low. In the case where the charge gain occurs because threshold voltages of the selected memory cells increase on the whole, the memory controller 110 may set the sixth charge gain starting level SL_6b to be relatively high.

As described above, the charge loss may occur strongly in a relatively high program state, and the charge gain may occur strongly in a relatively low program state. This means that a distance of RG56a is relatively narrower than a distance of RG56b, compared to the distance of RG56. In this case, "RG56" indicates a distance between crests of the fifth and sixth program states P5 and P6, "RG56a" indicates a distance between crests of the fifth and sixth charge loss states P5a and P6a, and "RG56b" indicates a distance between crests of the fifth and sixth charge gain program states P5b and P6b. Accordingly, as in the above description, the sixth charge loss offset OF_6a may be smaller than the sixth charge gain offset OF_6b.

In an example embodiment, as described above, even though the same degradation occurs at memory cells, the intensity of degradation may vary depending on program states of the memory cells. As such, a starting level and an offset may be controlled individually.

As described above, the memory controller 110 according to an example embodiment may control operation parameters (e.g., starting levels and offsets) for the valley search operation, based on a degradation state of selected memory cells. In an example embodiment, a degradation state of memory cells may include information about an increasing tendency or a decreasing tendency of threshold voltages of selected memory cells and information about a distance between adjacent program states. Starting levels may be controlled depending on an increasing tendency or a decreasing tendency of threshold voltages of selected memory cells. Offsets may be determined based on a distance between adjacent program states. In an example embodiment, an offset may be the same as or smaller than ⅓ times the distance between adjacent program states.

As described above, operation parameters for the valley search operation may be controlled depending on various degradation states, and thus, the accuracy of search for an optimal read level may be improved.

Figure 11:
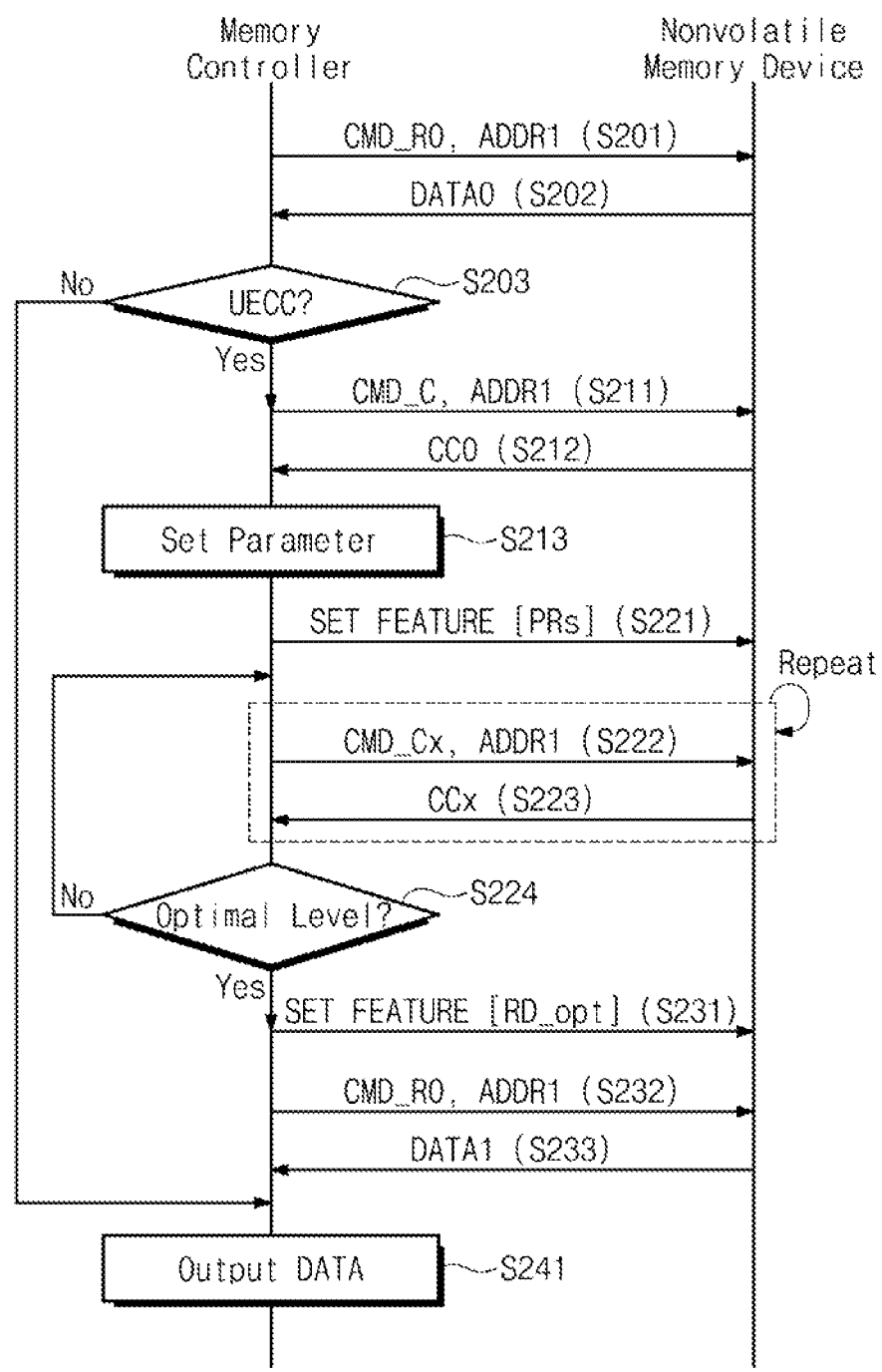
FIG. 11 is a flowchart illustrating an operation of a storage device of FIG. 1.

FIG. 11 is a flowchart illustrating an operation of a storage device of FIG. 1. An operation (i.e., a signal transfer operation or an interface operation) between the memory controller 110 and the nonvolatile memory device 120 included in the storage device 100 will be mainly described with reference to FIG. 11. However, the present disclosure is not limited thereto. For example, the memory controller 110 and the nonvolatile memory device 120 of the storage device 100 may perform the operations described with reference to FIGS. 1 to 10.

Referring to FIGS. 1 and 11, in operation S201, the memory controller 110 may transmit a 0-th read command CMD_R0 and a first address ADDR1 to the nonvolatile memory device 120. For example, to read data stored in an area corresponding to the first address ADDR1, the memory controller 110 may transmit the 0-th read command CMD_R0 and the first address ADDR1 to the nonvolatile memory device 120.

In operation S202, the nonvolatile memory device 120 may transmit 0-th data DATA0 to the memory controller 110. For example, in response to the 0-th read command CMD_R0, the nonvolatile memory device 120 may read the 0-th data DATA0 stored in the area corresponding to the first address ADDR1 by using a plurality of read voltages (e.g., VRD1 to VRD7).

In operation S203, the memory controller 110 may determine whether the UECC data occur. A configuration for determining the UECC data is described above, and thus, additional description will be omitted to avoid redundancy.

When the UECC data do not occur (No), in operation S241, the memory controller 110 may transmit error-corrected data to the external host device. In an example embodiment, in the case where the read operation according to the flowchart of FIG. 11 is for an internal management operation (e.g., a garbage collection operation or a read reclaim operation), the memory controller 110 may not transmit data to the external host device. The memory controller 110 may user the data for an internal operation.

When the UECC data do occur (Yes), in operation S211, the memory controller 110 may transmit a cell-counting command CMD_C and the first address ADDR1 to the nonvolatile memory device 120.

In operation S212, the nonvolatile memory device 120 may transmit a 0-th cell-counting value CC0 to the memory controller 110. For example, in response to the cell-counting command CMD_C, the nonvolatile memory device 120 may perform the cell-counting operation on the memory cells corresponding to the first address ADDR1. In an example embodiment, the cell-counting operation may be performed by using the cell-counting voltages VOC_1 and VOC_2 as described with reference to FIGS. 9A and 9B.

In an example embodiment, a cell-counting value may indicate the number of memory cells turned on or turned off by cell-counting voltages. In this case, the cell-counting value may indicate a value that is obtained by performing, at the nonvolatile memory device 120, the cell-counting operation on data read by using the cell-counting voltages. In another implementation, the memory controller 110 may calculate the cell-counting value based on the data read by using the cell-counting voltages. In other words, the memory controller 110 may receive data read by using the cell-counting voltages from the nonvolatile memory device 120 and may determine the cell-counting value based on the received data. In an example embodiment, the memory controller 110 may receive the above data through a direct memory access (DMA) operation and may perform a counting operation on the received data. In an example embodiment, the cell-counting value may be referred to as "cell counting data". Thus, the cell counting data may directly indicate the number of on-cells or off-cells or may indicate data to be counted by the memory controller 110.

Below, for convenience of description, the description will be given as a cell-counting value is transmitted from the nonvolatile memory device 120, but the present disclosure is not limited thereto. For example, a cell-counting value may be determined by the memory controller 110 based on data received from the nonvolatile memory device 120 as described above.

In operation S213, the memory controller 110 may set operation parameters based on the cell-counting value CC0. For example, as described with reference to FIGS. 8 to 10B, the memory controller 110 may determine a degradation state of selected memory cells based on the cell-counting value CC0. The memory controller 110 may set a plurality of operation parameters (e.g., a plurality of starting levels and a plurality of offsets corresponding to each of program states) for the valley search operation, based on the determined degradation state. A method of setting a plurality of operation parameters is described above, and thus, additional description will be omitted to avoid redundancy. In an example embodiment, operation parameters to be controlled may be selected depending on a degradation state of memory cells and a target page.

In operation S221, the memory controller 110 may transmit a set feature command SET FEATURE to the nonvolatile memory device 120. The set feature command SET FEATURE in operation S221 may be a command for setting the operation parameters, adjusted in operation S213, to the nonvolatile memory device 120.

In operation S222, the memory controller 110 may transmit a cell-counting command CMD_Cx and the first address ADDR1 to the nonvolatile memory device 120.

In operation S223, the nonvolatile memory device 120 may transmit a cell-counting value CCx to the memory controller 110.

In an example embodiment, operation S222 and operation S223 may correspond to a cell-counting operation that is performed for the valley search operation for searching one valley between adjacent program states, as described with reference to FIGS. 7, 10A, and 10B. For example, as described with reference to FIG. 10A, in the case of searching an optimal read level between the second and third charge loss states P2a and P3a, through operation S222 and operation S223, a cell-counting operation may be performed by using one of levels (e.g., [SL_3a−2×OF_3a], [SL_3a−OF_3a], [SL_3a], and [SL_3a+OF_3a]) included in the third charge loss window WD_3a. The memory controller 110 and the nonvolatile memory device 120 may repeat operation S222 and operation S223 to sequentially perform the cell-counting operations by using the levels included in the third charge loss window WD_3a. In an example embodiment, in the case of searching one optimal read level between adjacent program states, operation S222 and operation S223 may be performed at least four times. In the case of searching "n" optimal read levels between adjacent program states, operation S222 and operation S223 may be performed at least "n×4" times.

In operation S224, the memory controller 110 may search an optimal read level. The operation of searching the optimal read level is described with reference to FIG. 7, and thus, additional description will be omitted to avoid redundancy.

When an optimal read level is not obtained (No), the memory controller 110 may change operation parameters to again perform operation S222 and operation S223. In this case, operation S222 and operation S223 (i.e., a cell-counting operation) may be performed at least once, an optimal read level may be again searched based on results of the previously performed cell-counting operations and the re-performed cell-counting operation.

When the optimal read level is obtained (Yes), in operation S231, the memory controller 110 may transmit the set feature command SET FEATURE to the nonvolatile memory device 120. The set feature command SET FEATURE in operation S231 may be a command for setting the optimal read level thus found to the nonvolatile memory device 120.

In operation S232, the memory controller 110 may transmit the 0-th read command CMD_R0 and the first address ADDR1 to the nonvolatile memory device 120.

In operation S233, the nonvolatile memory device 120 may transmit first data DATA1 to the memory controller 110. For example, the nonvolatile memory device 120 may read data corresponding to the first address ADDR1 in response to the 0-th read command CMD_R0. In this case, because the optimal read level is set in operation S231, the nonvolatile memory device 120 may perform the read operation on the selected memory cells corresponding to the first address ADDR1 by using the optimal read level thus set.

Afterwards, in operation S241, the memory controller 110 may transmit the read data to the external host device. In an example embodiment, the memory controller 110 may perform an error correction operation on the first data DATA1 read after operation S223 and may transmit the first data DATA1 to the external host device depending on a result of the error correction operation (i.e., when an error is corrected).

Figure 12:
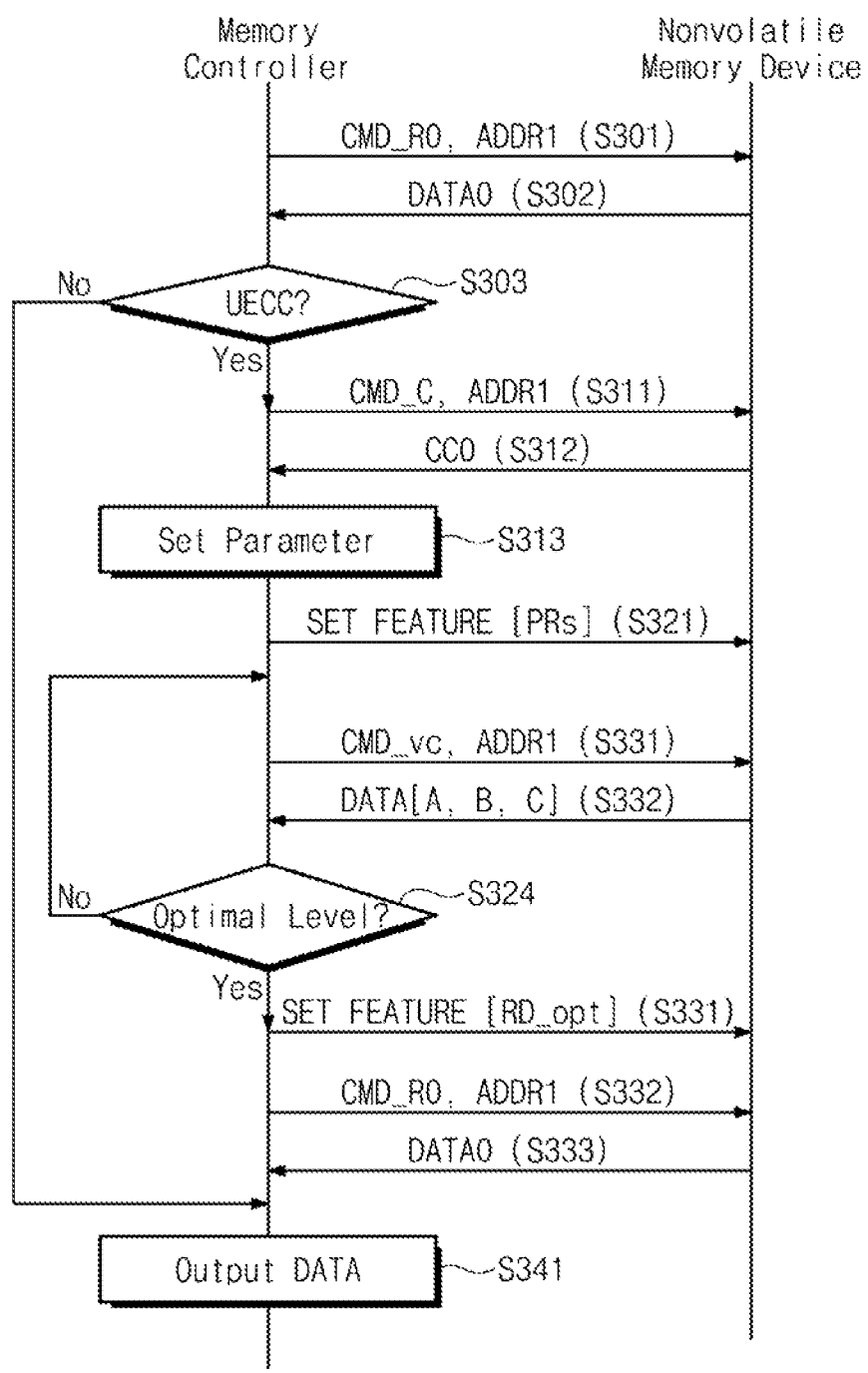
FIG. 12 is a flowchart illustrating an operation of a storage device of FIG. 1.

FIG. 12 is a flowchart illustrating an operation of a storage device of FIG. 1.

Referring to FIGS. 1 and 12, the nonvolatile memory device 120 may perform operation S301 to operation S321. Operation S301 to operation S321 may be the same as or similar to operation S201 to operation S221 of FIG. 11, and thus, additional description will be omitted to avoid redundancy.

In operation S331, the memory controller 110 may transmit a valley search command CMD_vc and the first address ADDR1 to the nonvolatile memory device 120.

In operation S332, the nonvolatile memory device 120 may transmit the data "DATA" to the memory controller 110. In an example embodiment, the data "DATA" in operation S332 may include information about the number of memory cells included in each of the areas "A", "B", and "C" described with reference to FIG. 7. For example, the nonvolatile memory device 120 may perform the cell-counting operation based on the operation parameters set in operation S321. The nonvolatile memory device 120 may compute the number of memory cells included in each of the areas "A", "B", and "C" based on cell-counting results. The nonvolatile memory device 120 may transmit a result of the computation to the memory controller 110 as the data "DATA".

Afterwards, the memory controller 110 and the nonvolatile memory device 120 may perform operation S324 to operation S341. Operation S324 to operation S341 may be the same as or similar to operation S224 to operation S241 of FIG. 11, and thus, additional description will be omitted to avoid redundancy.

The example embodiment of FIG. 11 (in which a command transfer and a data transfer are repeated for one valley search operation) may be different from the example embodiment of FIG. 12 (in which one command transfer and one data transfer are only performed for one valley search operation). Thus, the nonvolatile memory device 120 may perform cell-counting operations based on set operation parameters in response to a valley search command and may transmit the number of memory cells included in each area of a window to the memory controller 110, based on results of the cell-counting operations. The memory controller 110 may search an optimal read level based on the received data (i.e., information about the number of memory cells included in each area of the window).

Figure 13:
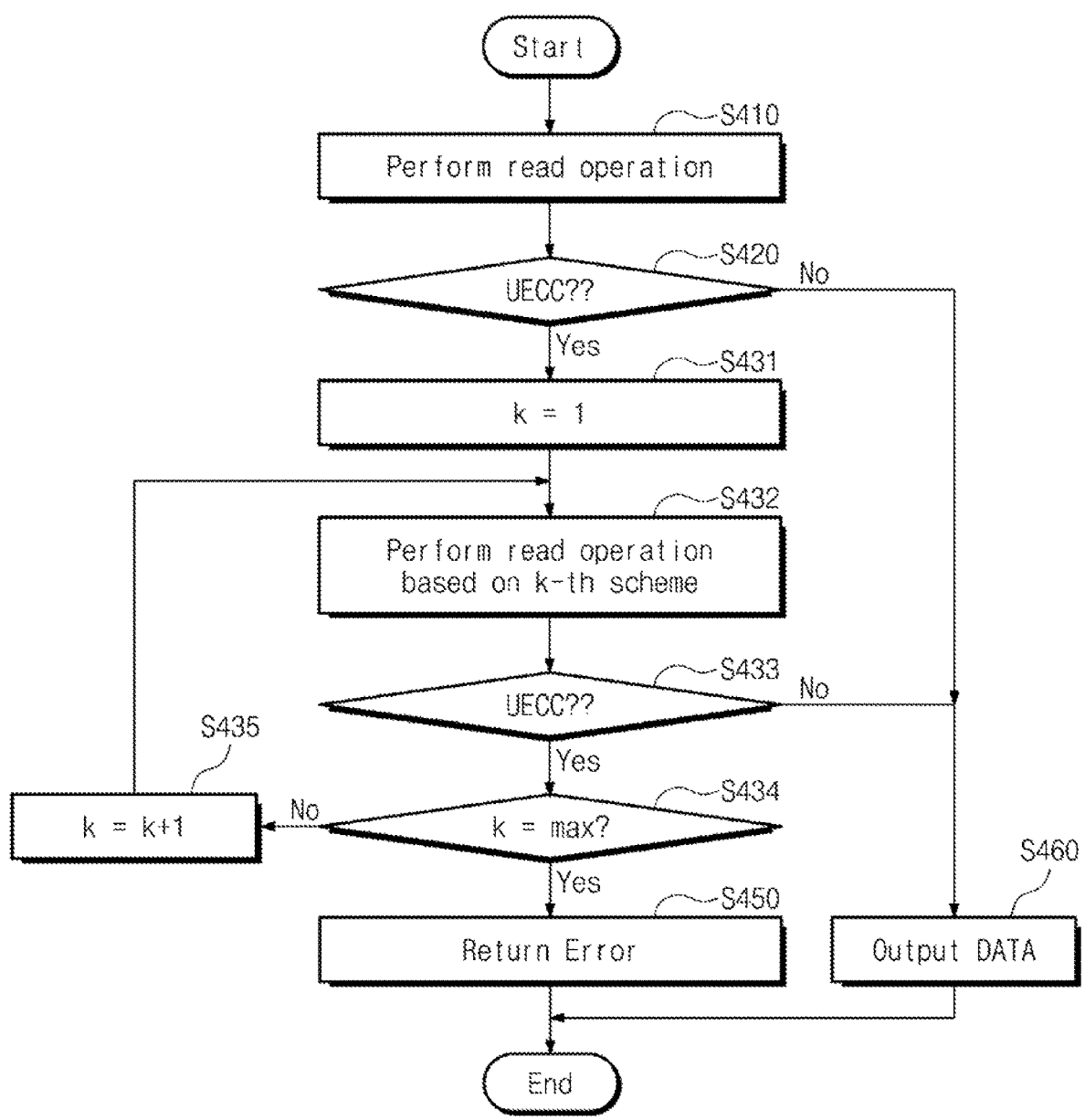
FIG. 13 is a flowchart illustrating an operation of a memory controller of FIG. 1.

FIG. 13 is a flowchart illustrating an operation of a memory controller of FIG. 1. For convenience of description, additional description associated with the components or operation methods described above will be omitted to avoid redundancy.

Referring to FIGS. 1 and 13, in operation S410, the memory controller 110 may perform a read operation.

In operation S420, the memory controller 110 may determine whether the UECC data occur. When the UECC data do not occur (No), in operation S460, the memory controller 110 may output data.

When the UECC data do occur (Yes), in operation S431, a variable "k" is set to "1". The variable "k" is only for describing an iterative operation, and the present disclosure is not limited thereto.

In operation S432, the memory controller 110 may perform the read operation based on a k-th scheme.

In operation S433, the memory controller 110 may determine whether the UECC data occur. When the UECC data do not occur, in operation S460, the memory controller 110 may output data. When the UECC data do occur (Yes), in operation S434, whether the variable "k" is a maximum value may be determined. When the variable "k" is not a maximum value, in operation S435, the variable "k" increases as much as "1". Afterwards, the memory controller 110 again performs operation S432. The memory controller 110 may repeat operation S432 to operation S435 until the UECC data do not occur or the variable "k" is the maximum value.

In an example embodiment, the memory controller 110 may correct an error of data read from the nonvolatile memory device 120 through various schemes. For example, the memory controller 110 may perform the read operation based on a predetermined table PDT. The predetermined table PDT may include information about a plurality of read voltage sets. Each of the plurality of read voltage sets may be a set for different read voltages. For example, a first read voltage set may include information about the first to seventh read voltages VRD1 to VRD7, and a second read voltage set may include information about read voltages different from the first to seventh read voltages VRD1 to VRD7. In another implementation, the memory controller 110 may correct an error of the read data based on soft decoding. In an example embodiment, the above error correction schemes are provided by ways of example, and the present disclosure is not limited thereto.

As described above, the memory controller 110 may correct an error of data read from the nonvolatile memory device 120 by performing the read operation based on various error correction schemes. In an example embodiment, the valley search operation according to an example embodiment may be one of the plurality of error correction schemes described above. In an example embodiment, operation parameters for the valley search operation may be determined based on data read through an error correction scheme used before the valley search operation. For example, in the case where the memory controller 110 performs a read operation based on a PDT scheme before the valley search operation, the memory controller 110 may determine a degradation state of memory cells based on data read through the PDT scheme and may set operation parameters for the valley search operation based on the determined degradation characteristic.

When an error is not corrected through all error correction schemes (i.e., when a result of operation S434 is "Yes"), in operation S450, the memory controller 110 may return an error.

Figure 14:
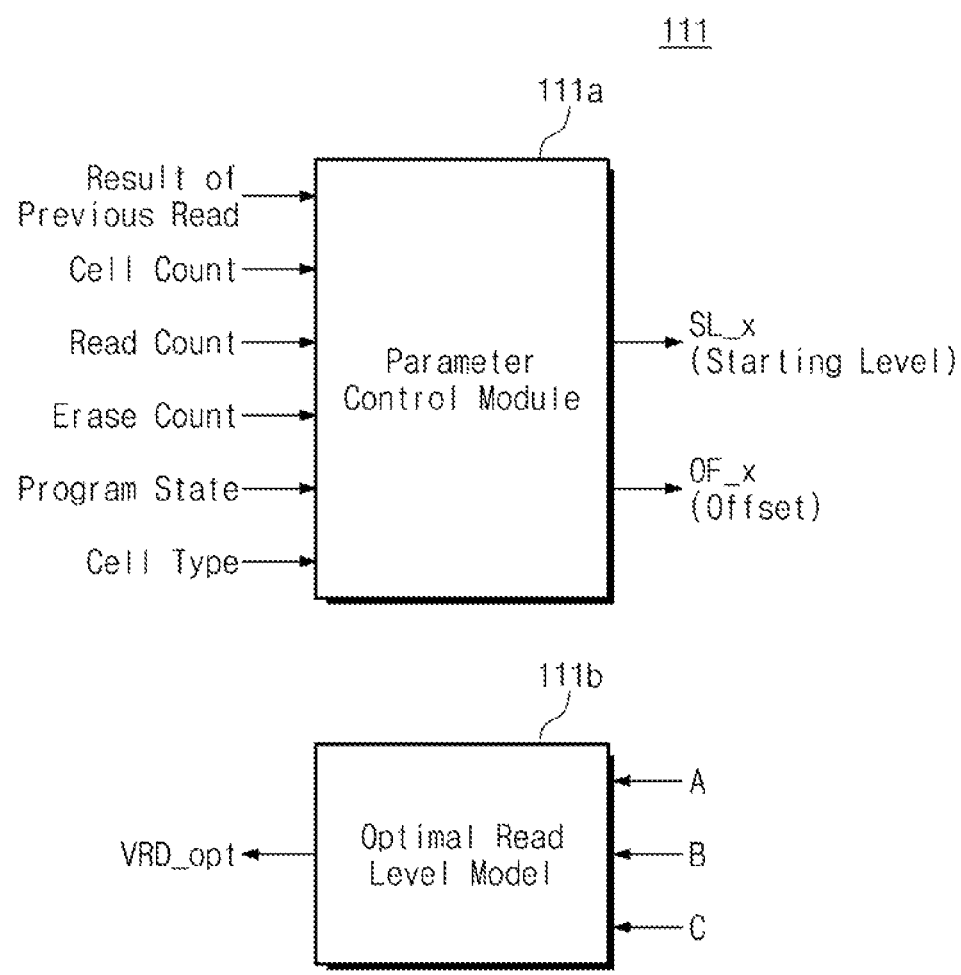
FIG. 14 is a block diagram illustrating a read level manager of a memory controller of FIG. 1.

FIG. 14 is a block diagram illustrating a read level manager of a memory controller of FIG. 1.

Referring to FIGS. 1 and 14, the read level manager 111 may include a parameter control module 111a and an optimal read level model 111b.

The parameter control module 111a may determine operation parameters (i.e., starting levels SL_x and offsets OF_x) for the valley search operation based on various input information. In an example embodiment, various input information may include at least one of various information such as results of previous read operations for selected memory cells, a cell-counting result (Cell Count) for the selected memory cells, a read count (Read Count) for the selected memory cells, an erase count (Erase Count) for the selected memory cells, a program state (Program State) targeted for the valley search operation, and a cell type (Cell Type) of the selected memory cells. In an example embodiment, the memory controller 110 may manage various information about memory blocks, word lines, or memory cells of the nonvolatile memory device 120, such as a read count, an erase count, a cell type, and a program state. The parameter control module 111a may control operation parameters based on various information managed at the memory controller 110, as well as a cell-counting value for selected memory cells.

For example, as described with reference to FIGS. 10A and 10B, the parameter control module 111a of the read level manager 111 may determine a degradation state of selected memory cells based on a cell-counting value. The parameter control module 111a may set operation parameters based on the degradation state and the program state. However, the present disclosure is not limited thereto. The parameter control module 111a may control the operation parameters SL_x and OF_x for the valley search operation based on various input information.

As described with reference to FIG. 7, the optimal read level model 111b may search an optimal read level VRD_opt based on the number of memory cells included in each of the areas "A", "B", and "C" of a window. For example, the optimal read level model 111b may determine an optimal read level by modeling a second-order function based on the input information (i.e., the number of memory cells included in each of the areas "A", "B", and "C" of the window) and then searching a valley of the second-order function.

In an example embodiment, based on a learning model learned in advance based on information about various degradation states, the parameter control module 111a may perform machine learning on various input information to control operation parameters. In an example embodiment, the read level manager 111 may be a hardware accelerator configured to perform machine learning. In another implementation, the parameter control module 111a may be configured to control operation parameters based on an adaptive algorithm.

Figure 15:
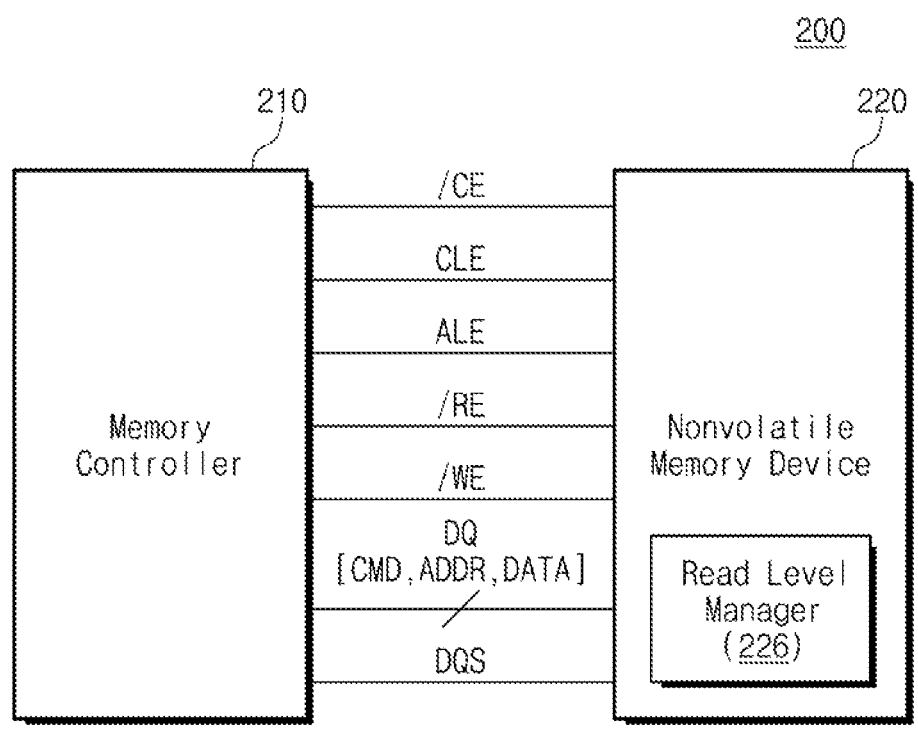
FIG. 15 is a block diagram illustrating a storage device according to an example embodiment.

FIG. 15 is a block diagram illustrating a storage device according to an example embodiment.

Referring to FIG. 15, a storage device 200 may include a memory controller 210 and a nonvolatile memory device 220. The memory controller 210 and the nonvolatile memory device 220 may exchange various signals (e.g., /CE, CLE, /RE, /WE, DQ, and DQS). The memory controller 210 and the nonvolatile memory device 220 are described above, and thus, additional description will be omitted to avoid redundancy.

In an example embodiment, the nonvolatile memory device 220 may include a read level manager 226. In the embodiments described with reference to FIGS. 1 to 14, the memory controller 110 may set operation parameters for the valley search operation and may search optimal read levels. On the other hand, in the embodiment of FIG. 15, the nonvolatile memory device 220 may perform the above operations without intervention of the memory controller 210. Thus, the nonvolatile memory device 220 may include the read level manager 226 configured to set operation parameters and perform the valley search operation, which are described with reference to FIGS. 1 to 14.

Figure 16:
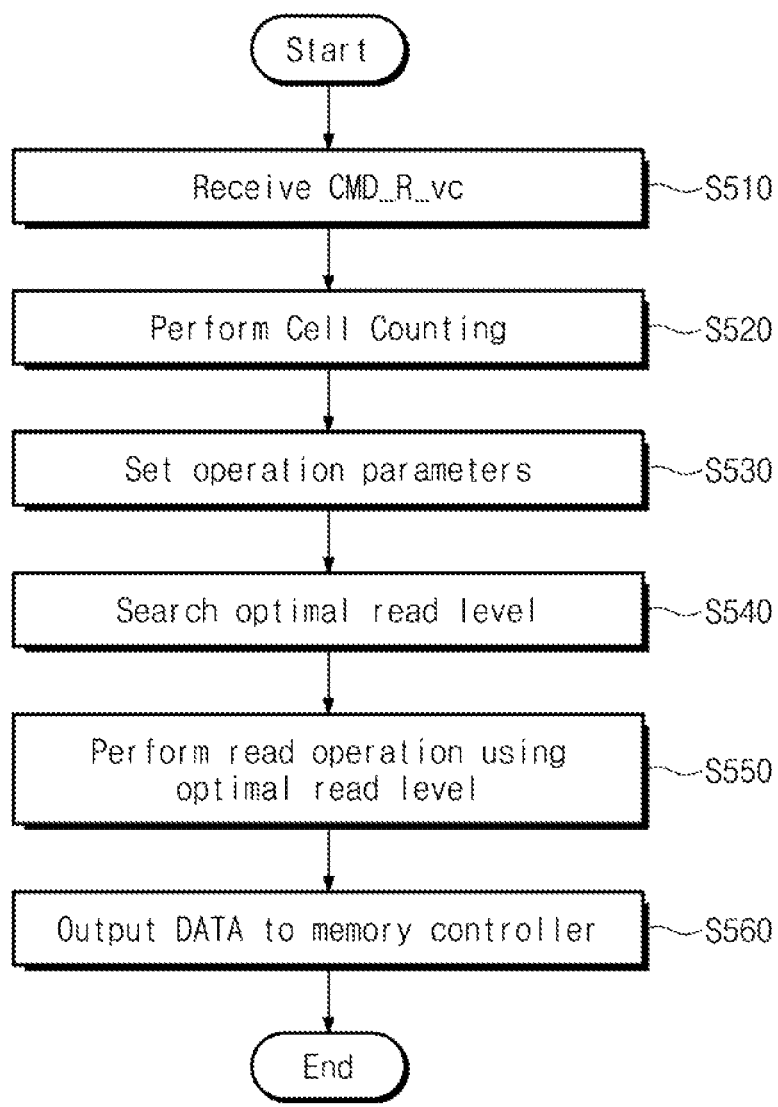
FIG. 16 is a flowchart illustrating an operation of a nonvolatile memory device of FIG. 15.

FIG. 16 is a flowchart illustrating an operation of a nonvolatile memory device of FIG. 15.

Referring to FIGS. 15 and 16, in operation S510, the nonvolatile memory device 220 may receive a valley search read command CMD_R_vc.

In operation S520, the nonvolatile memory device 220 may perform a cell-counting operation. For example, the nonvolatile memory device 220 may perform the cell-counting operation by using a cell-counting voltage determined in advance.

In operation S530, the nonvolatile memory device 220 may set operation parameters for the valley search operation based on a result of the cell-counting operation. For example, the read level manager 226 of the nonvolatile memory device 220 may determine a degradation state of selected memory cells based on the result of the cell-counting operation in operation S520. The read level manager 226 may set operation parameters based on the degradation state. An operation of setting operation parameters is described above, and thus, additional description will be omitted to avoid redundancy.

In operation S540, the nonvolatile memory device 220 may search an optimal read level. For example, the nonvolatile memory device 220 may set a window based on the set operation parameters and may perform the cell-counting operation based on a plurality of levels included in the set window. The read level manager 226 of the nonvolatile memory device 220 may search an optimal read level based on cell-counting results. The valley search operation for searching an optimal read level is similar to the above valley search operation except that the valley search operation is performed at the nonvolatile memory device 220, and thus, additional description will be omitted to avoid redundancy.

In operation S550, the nonvolatile memory device 220 may perform a read operation by using optimal read levels. In an example embodiment, because the valley search operation is performed within the nonvolatile memory device 220, a separate set feature command may not be received from the memory controller 210.

In operation S560, the nonvolatile memory device 220 may transmit read data to the memory controller 210. In an example embodiment, the memory controller 210 may perform an error correction operation on the received data; when an error is not corrected, the memory controller 210 may control the nonvolatile memory device 220 based on another error correction scheme.

As described above, the nonvolatile memory device 220 may perform the valley search operation under control of the memory controller 210. In this case, the nonvolatile memory device 220 may determine a degradation state of memory cells, may set operation parameters based on the determined degradation state, may perform a valley search operation based on the set operation parameters to determine an optimal read level, and may perform a read operation based on the optimal read level. The nonvolatile memory device 220 may perform the above operations in response to one command sequence from the memory controller 210.

Figure 17:
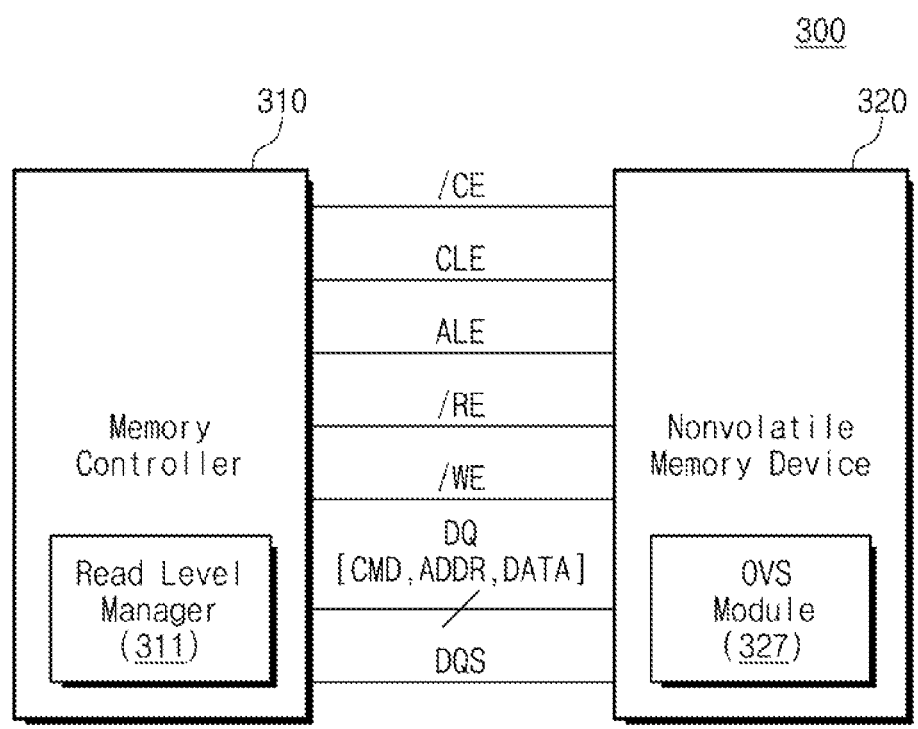
FIG. 17 is a block diagram illustrating a storage device according to an example embodiment.
Figure 18:
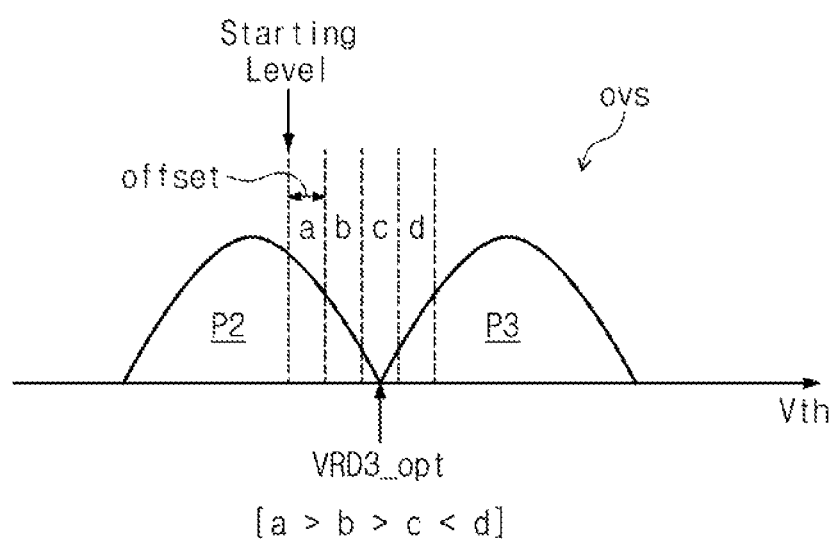
FIG. 18 is a diagram for describing an on-chip valley search operation of a nonvolatile memory device of FIG. 17.

FIG. 17 is a block diagram illustrating a storage device according to an example embodiment. FIG. 18 is a diagram for describing an on-chip valley search operation of a nonvolatile memory device of FIG. 17.

Referring to FIGS. 17 and 18, a storage device 300 may include a memory controller 310 and a nonvolatile memory device 320. The memory controller 310 and the nonvolatile memory device 320 may exchange various signals (e.g., /CE, CLE, /RE, /WE, DQ, and DQS). The memory controller 310 and the nonvolatile memory device 320 are described above, and thus, additional description will be omitted to avoid redundancy.

The memory controller 310 may include a read level manager 311. The read level manager 311 may set operation parameters based on a degradation state of selected memory cells. The nonvolatile memory device 320 may include an on-chip valley search (OVS) module 327. The OVS module 327 may perform an on-chip valley search operation based on the operation parameters set by the memory controller 310.

In an example embodiment, the on-chip valley search operation may be different from the valley search operation described with reference to FIGS. 1 to 16. For example, referring to FIG. 18, in the case where an on-chip valley search operation for the second and third program states P2 and P3 is performed, the nonvolatile memory device 320 may perform cell-counting that starts from a starting level, and the starting level may be stepwise increased as much as an offset as the cell-counting progresses. The number of memory cells included in each of areas "a", "b", "c", and "d" may be detected based on a result of the cell-counting. The OVS module 327 of the nonvolatile memory device 320 may search an optimal read level based on a change of a value of each area (i.e., an increment/decrement of a value of each area). For example, while a cell-counting voltage increases from "a" to "d", memory cell counts may have a relationship of "a>b>c<d". In this case, the OVS module 327 may determine a voltage level included in the area "c" (i.e., an area where the number of memory cells decreases and then increases) as the third optimal read voltage VRD3_opt.

The read level manager 311 of the memory controller 310 may determine a degradation state of selected memory cells based on the scheme described with reference to FIGS. 1 to 16. The read level manager 311 may be configured to determine operation parameters (i.e., a starting level and an offset illustrated in FIG. 18) for the on-chip valley search operation based on the degradation state. The OVS module 327 of the nonvolatile memory device 320 may perform the on-chip valley search operation (refer to FIG. 18) based on the operation parameters set by the read level manager 311.

As described above, a storage device according to an example embodiment may perform a valley search operation for the purpose of searching an optimal read level of read voltages used at a nonvolatile memory device. In this case, operation parameters (e.g., a starting level and an offset) may be set based on the degradation state of the selected memory cells of the nonvolatile memory device, and a valley search operation may be performed based on the operation parameters thus set. In an example embodiment, the determining of the degradation state and the setting of the operation parameters may be performed based on machine learning or an adaptive algorithm. Accordingly, a storage device with improved reliability may be provided.

Figure 19:
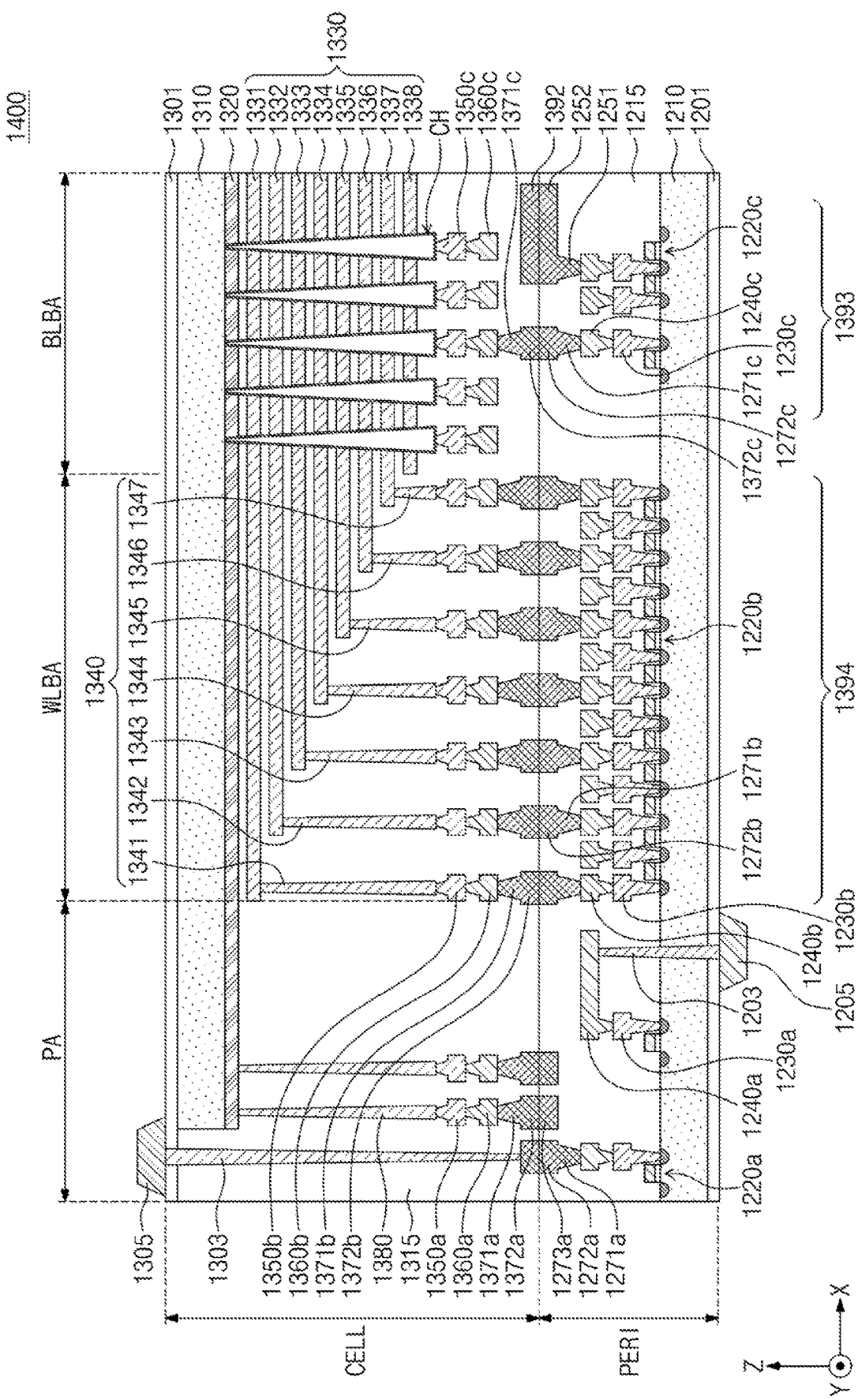
FIG. 19 is a diagram illustrating a memory device according to another example embodiment.

FIG. 19 is a diagram illustrating a memory device 1400 according to another example embodiment.

Referring to FIG. 19, a memory device 1400 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, the bonding metals may include copper (Cu) and the chips may be bonded together using a Cu—Cu bonding. The present example embodiment, however, is not limited thereto. For example, the bonding metals may also be formed of aluminum (Al) or tungsten (W).

Each of the peripheral circuit region PERI and the cell region CELL of the memory device 1400 may include an external pad bonding area PA, a word line bonding area WLBA, and a bit line bonding area BLBA.

The peripheral circuit region PERI may include a first substrate 1210, an interlayer insulating layer 1215, a plurality of circuit elements 1220a, 1220b, and 1220c formed on the first substrate 1210, first metal layers 1230a, 1230b, and 1230c respectively connected to the plurality of circuit elements 1220a, 1220b, and 1220c, and second metal layers 1240a, 1240b, and 1240c formed on the first metal layers 1230a, 1230b, and 1230c. In an example embodiment, the first metal layers 1230a, 1230b, and 1230c may be formed of tungsten having relatively high electrical resistance, and the second metal layers 1240*a*, 1240*b*, and 1240*c* may be formed of copper having relatively low electrical resistance.

In the example embodiment illustrated in FIG. 19, although only the first metal layers 1230*a*, 1230*b*, and 1230*c* and the second metal layers 1240*a*, 1240*b*, and 1240*c* are shown and described, the example embodiment is not limited thereto, and one or more additional metal layers may be further formed on the second metal layers 1240*a*, 1240*b*, and 1240*c*. At least a portion of the one or more additional metal layers formed on the second metal layers 1240*a*, 1240*b*, and 1240*c* may be formed of aluminum or the like having a lower electrical resistance than those of copper forming the second metal layers 1240*a*, 1240*b*, and 1240*c*.

The interlayer insulating layer 1215 may be disposed on the first substrate 1210 and cover the plurality of circuit elements 1220*a*, 1220*b*, and 1220*c*, the first metal layers 1230*a*, 1230*b*, and 1230*c*, and the second metal layers 1240*a*, 1240*b*, and 1240*c*. The interlayer insulating layer 1215 may include an insulating material such as silicon oxide, silicon nitride, or the like.

Lower bonding metals 1271*b* and 1272*b* may be formed on the second metal layer 1240*b* in the word line bonding area WLBA. In the word line bonding area WLBA, the lower bonding metals 1271*b* and 1272*b* in the peripheral circuit region PERI may be electrically bonded to upper bonding metals 1371*b* and 1372*b* of the cell region CELL. The lower bonding metals 1271*b* and 1272*b* and the upper bonding metals 1371*b* and 1372*b* may be formed of aluminum, copper, tungsten, or the like.

Further, the upper bonding metals 1371*b* and 1372*b* in the cell region CELL may be referred as first metal pads and the lower bonding metals 1271*b* and 1272*b* in the peripheral circuit region PERI may be referred as second metal pads.

The cell region CELL may include at least one memory block. The cell region CELL may include a second substrate 1310, an interlayer insulating layer 1315 and a common source line 1320. On the second substrate 1310, a plurality of word lines 1331 to 1338 (i.e., 1330) may be stacked in a direction (a Z-axis direction), perpendicular to an upper surface of the second substrate 1310. At least one string select line and at least one ground select line may be arranged on and below the plurality of word lines 1330, respectively, and the plurality of word lines 1330 may be disposed between the at least one string select line and the at least one ground select line.

Widths of the plurality of word lines 1330 along the X-direction may be different each other. As a distance from the first substrate 1210 of the peripheral circuit region PERI to respective one of the plurality of word line 1330 increases, the width of the respective one of the plurality of word line 1330 decreases. Similarly, as a distance from the second substrate 1310 of the cell region CELL to respective one of the plurality of word line 1330 increases, the width of the respective one of the plurality of word line 1330 increases.

In the bit line bonding area BLBA, a channel structure CH may extend in a direction (a Z-axis direction), perpendicular to the upper surface of the second substrate 1310, and pass through the plurality of word lines 1330, the at least one string select line, and the at least one ground select line. The channel structure CH may include a data storage layer, a channel layer, a buried insulating layer, and the like, and the channel layer may be electrically connected to a first metal layer 1350*c* and a second metal layer 1360*c*. For example, the first metal layer 1350*c* may be a bit line contact, and the second metal layer 1360*c* may be a bit line. In an example embodiment, the bit line 1360*c* may extend in a first direction (a Y-axis direction), parallel to the upper surface of the second substrate 1310.

The interlayer insulating layer 1315 may be disposed on the second substrate 1310 and cover the common source line 1320, the plurality of word lines 1330, the plurality of cell contact plugs 1340, the first metal layer 1350*a*, 1350*b* and 1350*c*, and the second metal layer 1360*a*, 1360*b* and 1360*b*. The interlayer insulating layer 1315 may include an insulating material such as silicon oxide, silicon nitride, or the like.

In the example embodiment illustrated in FIG. 19, an area in which the channel structure CH, the bit line 1360*c*, and the like are disposed may be defined as the bit line bonding area BLBA. In the bit line bonding area BLBA, the bit line 1360*c* may be electrically connected to the circuit elements 1220*c* providing a page buffer 1393 in the peripheral circuit region PERI. The bit line 1360*c* may be connected to upper bonding metals 1371*c* and 1372*c* in the cell region CELL, and the upper bonding metals 1371*c* and 1372*c* may be connected to lower bonding metals 1271*c* and 1272*c* connected to the circuit elements 1220*c* of the page buffer 1393.

In the word line bonding area WLBA, the plurality of word lines 1330 may extend in a second direction (an X-axis direction), parallel to the upper surface of the second substrate 1310 and perpendicular to the first direction, and may be connected to a plurality of cell contact plugs 1341 to 1347 (i.e., 1340). The plurality of word lines 1330 and the plurality of cell contact plugs 1340 may be connected to each other in pads provided by at least a portion of the plurality of word lines 1330 extending in different lengths in the second direction. A first metal layer 1350*b* and a second metal layer 1360*b* may be connected to an upper portion of the plurality of cell contact plugs 1340 connected to the plurality of word lines 1330, sequentially. The plurality of cell contact plugs 1340 may be connected to the peripheral circuit region PERI by the upper bonding metals 1371*b* and 1372*b* of the cell region CELL and the lower bonding metals 1271*b* and 1272*b* of the peripheral circuit region PERI in the word line bonding area WLBA.

The plurality of cell contact plugs 1340 may be electrically connected to the circuit elements 1220*b* forming a row decoder 1394 in the peripheral circuit region PERI. In an example embodiment, operating voltages of the circuit elements 1220*b* of the row decoder 1394 may be different than operating voltages of the circuit elements 1220*c* forming the page buffer 1393. For example, operating voltages of the circuit elements 1220*c* forming the page buffer 1393 may be greater than operating voltages of the circuit elements 1220*b* forming the row decoder 1394.

A common source line contact plug 1380 may be disposed in the external pad bonding area PA. The common source line contact plug 1380 may be formed of a conductive material such as a metal, a metal compound, polysilicon, or the like, and may be electrically connected to the common source line 1320. A first metal layer 1350*a* and a second metal layer 1360*a* may be stacked on an upper portion of the common source line contact plug 1380, sequentially. For example, an area in which the common source line contact plug 1380, the first metal layer 1350*a*, and the second metal layer 1360*a* are disposed may be defined as the external pad bonding area PA.

Input-output pads 1205 and 1305 may be disposed in the external pad bonding area PA. Referring to FIG. 19, a lower insulating film 1201 covering a lower surface of the first substrate 1210 may be formed below the first substrate 1210, and a first input-output pad 1205 may be formed on the lower insulating film 1201. The first input-output pad 1205 may be connected to at least one of the plurality of circuit elements 1220a, 1220b, and 1220c disposed in the peripheral circuit region PERI through a first input-output contact plug 1203, and may be separated from the first substrate 1210 by the lower insulating film 1201. In addition, a side insulating film may be disposed between the first input-output contact plug 1203 and the first substrate 1210 to electrically separate the first input-output contact plug 1203 and the first substrate 1210.

Referring to FIG. 19, an upper insulating film 1301 covering the upper surface of the second substrate 1310 may be formed on the second substrate 1310, and a second input-output pad 1305 may be disposed on the upper insulating film 1301. The second input-output pad 1305 may be connected to at least one of the plurality of circuit elements 1220a, 1220b, and 1220c disposed in the peripheral circuit region PERI through a second input-output contact plug 1303. In the example embodiment, the second input-output pad 1305 is electrically connected to a circuit element 1220a.

According to embodiments, the second substrate 1310 and the common source line 1320 may not be disposed in an area in which the second input-output contact plug 1303 is disposed. Also, the second input-output pad 1305 may not overlap the word lines 1330 in the third direction (the Z-axis direction). Referring to FIG. 19, the second input-output contact plug 1303 may be separated from the second substrate 1310 in a direction, parallel to the upper surface of the second substrate 1310, and may pass through the interlayer insulating layer 1315 of the cell region CELL to be connected to the second input-output pad 1305 and the lower bonding metals 1271a and 1272a of the peripheral circuit area PERI.

According to embodiments, the first input-output pad 1205 and the second input-output pad 1305 may be selectively formed. For example, the memory device 1400 may include only the first input-output pad 1205 disposed on the first substrate 1210 or the second input-output pad 1305 disposed on the second substrate 1310. In another implementation, the memory device 1400 may include both the first input-output pad 1205 and the second input-output pad 1305.

A metal pattern provided on an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 1400 may include a lower metal pattern 1273a, corresponding to an upper metal pattern 1372a formed in an uppermost metal layer of the cell region CELL, and having the same cross-sectional shape as the upper metal pattern 1372a of the cell region CELL so as to be connected to each other, in an uppermost metal layer of the peripheral circuit region PERI. In the peripheral circuit region PERI, the lower metal pattern 1273a formed in the uppermost metal layer of the peripheral circuit region PERI may not be connected to a contact. Similarly, in the external pad bonding area PA, an upper metal pattern 1372a, corresponding to the lower metal pattern 1273a formed in an uppermost metal layer of the peripheral circuit region PERI, and having the same shape as a lower metal pattern 1273a of the peripheral circuit region PERI, may be formed in an uppermost metal layer of the cell region CELL.

The lower bonding metals 1271b and 1272b may be formed on the second metal layer 1240b in the word line bonding area WLBA. In the word line bonding area WLBA, the lower bonding metals 1271b and 1272b of the peripheral circuit region PERI may be electrically connected to the upper bonding metals 1371b and 1372b of the cell region CELL by a Cu-to-Cu bonding.

Further, in the bit line bonding area BLBA, an upper metal pattern 1392, corresponding to a lower metal pattern 1252 formed in the uppermost metal layer of the peripheral circuit region PERI, and having the same cross-sectional shape as the lower metal pattern 1252 of the peripheral circuit region PERI, may be formed in an uppermost metal layer of the cell region CELL. A contact may not be formed on the upper metal pattern 1392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in another one of the cell region CELL and the peripheral circuit region PERI. A contact may not be formed on the reinforcement metal pattern.

Figure 20:
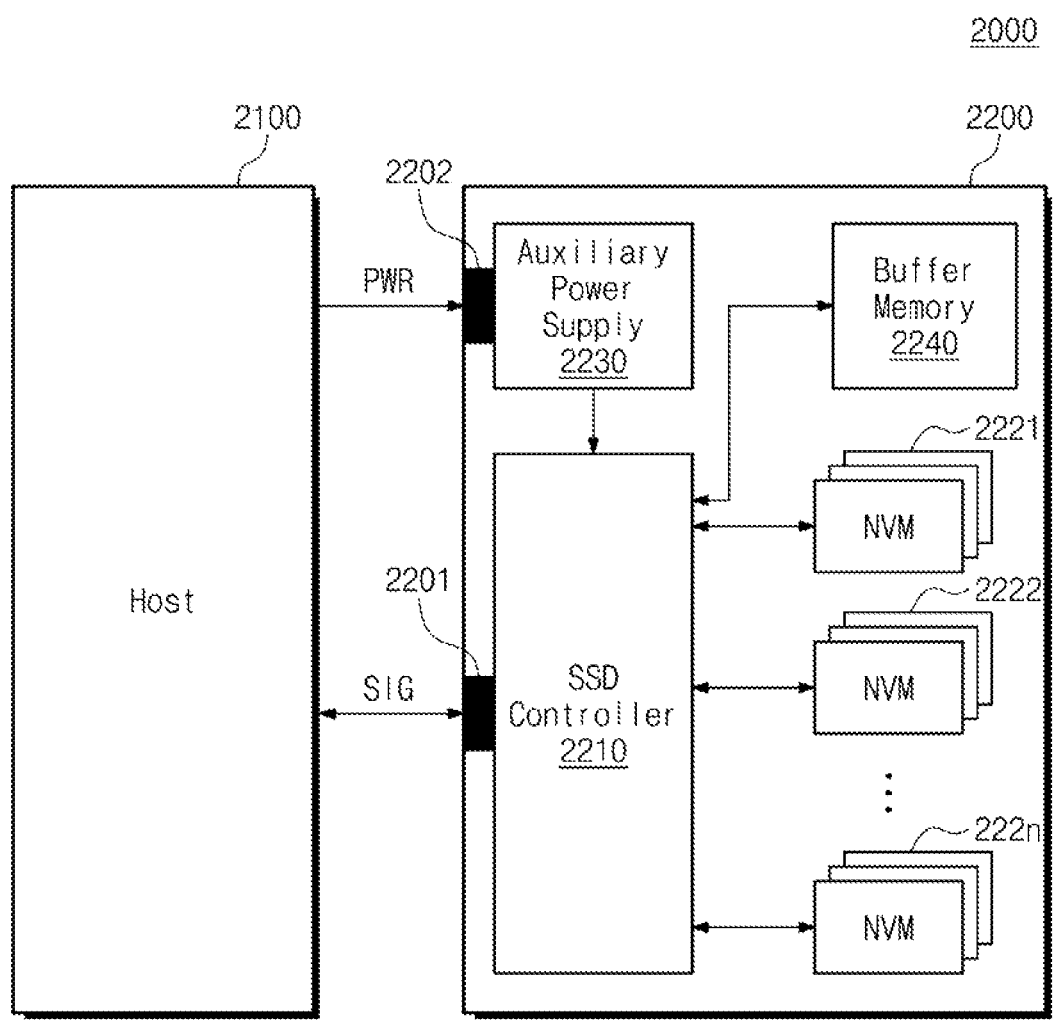
FIG. 20 is a block diagram illustrating an SSD system according to an example embodiment.

FIG. 20 is a block diagram illustrating an SSD system according to an example embodiment.

Referring to FIG. 20, a solid state drive (SSD) system 2000 includes a host 2100 and a storage device 2200. The storage device 2200 may exchange signals SIG with the host 2100 through a signal connector 2201 and may be supplied with a power PWR through a power connector 2202. The storage device 2200 may include an SSD controller 2210, a plurality of nonvolatile memories 2221 to 222n, an auxiliary power supply 2230, and a buffer memory 2240.

The SSD controller 2210 may control the plurality of nonvolatile memories 2221 to 222n in response to the signals SIG received from the host 2100. The plurality of nonvolatile memories 2221 to 222n may operate under control of the SSD controller 2210. The auxiliary power supply 2230 may be connected with the host 2100 through the power connector 2202. The auxiliary power supply 2230 may be charged by the power PWR from the host 2100. When the power PWR is not smoothly supplied from the host 2100, the auxiliary power supply 2230 may power the storage device 2200. The buffer memory 2240 may be used as a buffer memory of the storage device 2200. In an example embodiment, the SSD system 2000 may perform the read operation or the valley search operation based on the method described with reference to FIGS. 1 to 18.

By way of summation and review, data stored in the flash memory may include an error due to various external factors. A controller that controls the flash memory may correct an error of data read from the flash memory. However, in the case where an error that is uncorrectable by an error correction circuit of the controller occurs, another operation manner for correcting the error of data may be called for.

As described above, operation parameters for a valley search operation (performed to search an optimal read voltage of a nonvolatile memory device) may be controlled based on a degradation state of selected memory cells. As such, an optimal read level may be normally detected with regard to various degradation states. Accordingly, an operation method of a controller configured to control a nonvolatile memory device having improved reliability and an operation method of a storage device may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An operation method of a controller which is configured to control a nonvolatile memory device, the method comprising:
receiving cell counting data associated with selected memory cells included in the nonvolatile memory device from the nonvolatile memory device, wherein the receiving of the cell counting data associated with the selected memory cells included in the nonvolatile memory device from the nonvolatile memory device includes:
transmitting a first cell-counting command to the nonvolatile memory device; and
receiving the cell counting data from the nonvolatile memory device;
adjusting operation parameters of the nonvolatile memory device based on the cell counting data;
performing a valley search operation for the selected memory cells based on the adjusted operation parameters; and
performing a read operation for the selected memory cells based on a result of the valley search operation.

2. The method as claimed in claim 1, wherein the operation parameters include starting levels and offsets used in the valley search operation.

3. The method as claimed in claim 1, wherein the adjusting of the operation parameters of the nonvolatile memory device based on the cell counting data includes:
detecting a degradation state of the selected memory cells based on the cell counting data; and
controlling the operation parameters based on the degradation state.

4. The method as claimed in claim 3, wherein, when the degradation state indicates a charge loss state, a starting level of the operation parameters is decreased, and
wherein, when the degradation state indicates a charge gain state, the starting level of the operation parameters is increased.

5. The method as claimed in claim 3, wherein, when the degradation state indicates that a distance between adjacent program states decreases, an offset of the operation parameters is decreased, and
wherein, when the degradation state indicates that the distance between the adjacent program states increases, the offset of the operation parameters is increased.

6. The method as claimed in claim 3, wherein the controlling of the operation parameters based on the degradation state includes:
adjusting the operation parameters based on the degradation state; and
transmitting a set feature command including information about the adjusted operation parameters to the nonvolatile memory device.

7. The method as claimed in claim 3, wherein the degradation state of the selected memory cells is detected based on the cell counting data and at least one of a read count, an erase count, a program state, and a cell type associated with the selected memory cells.

8. The method as claimed in claim 7, wherein the degradation state is detected based on machine learning or an adaptive algorithm.

9. The method as claimed in claim 1, wherein the performing of the read operation for the selected memory cells based on the result of the valley search operation includes:
determining optimal read levels based on the result of the valley search operation; and
performing the read operation for the selected memory cells by using the optimal read levels.

10. The method as claimed in claim 9, wherein the performing of the read operation for the selected memory cells by using the optimal read levels includes:
transmitting a set feature command including information about the optimal read levels to the nonvolatile memory device;
transmitting an address corresponding to the selected memory cells and a read command to the nonvolatile memory device; and
receiving data that is read using the optimal read levels, from the nonvolatile memory device.

11. The method as claimed in claim 9, further comprising:
before receiving the cell counting data associated with the selected memory cells from the nonvolatile memory device, performing a read operation for the selected memory cells using a plurality of read voltages; and
correcting an error of data read by the read operation using the plurality of read voltages.

12. An operation method of a controller which is configured to control a nonvolatile memory device, the method comprising:
receiving cell counting data associated with selected memory cells included in the nonvolatile memory device from the nonvolatile memory device;
adjusting operation parameters of the nonvolatile memory device based on the cell counting data, wherein the adjusting of the operation parameters of the nonvolatile memory device based on the cell counting data includes:
detecting a degradation state of the selected memory cells based on the cell counting data; and
controlling the operation parameters based on the degradation state;
performing a valley search operation for the selected memory cells based on the adjusted operation parameters; and
performing a read operation for the selected memory cells based on a result of the valley search operation.

13. The method as claimed in claim 12, wherein the operation parameters include starting levels and offsets used in the valley search operation.

14. The method as claimed in claim 12, wherein, when the degradation state indicates a charge loss state, a starting level of the operation parameters is decreased, and wherein, when the degradation state indicates a charge gain state, the starting level of the operation parameters is increased.

15. The method as claimed in claim 12, wherein, when the degradation state indicates that a distance between adjacent program states decreases, an offset of the operation parameters is decreased, and wherein, when the degradation state indicates that the distance between the adjacent program states increases, the offset of the operation parameters is increased.

16. The method as claimed in claim 12, wherein the controlling of the operation parameters based on the degradation state includes:
adjusting the operation parameters based on the degradation state; and
transmitting a set feature command including information about the adjusted operation parameters to the nonvolatile memory device.

17. The method as claimed in claim 12, wherein the degradation state of the selected memory cells is detected based on the cell counting data and at least one of a read count, an erase count, a program state, and a cell type associated with the selected memory cells.

18. The method as claimed in claim 17, wherein the degradation state is detected based on machine learning or an adaptive algorithm.

19. An operation method of a controller which is configured to control a nonvolatile memory device, the method comprising:
receiving cell counting data associated with selected memory cells included in the nonvolatile memory device from the nonvolatile memory device;
adjusting operation parameters of the nonvolatile memory device based on the cell counting data;
performing a valley search operation for the selected memory cells based on the adjusted operation parameters; and
performing a read operation for the selected memory cells based on a result of the valley search operation, wherein the performing of the read operation for the selected memory cells based on the result of the valley search operation includes:
determining optimal read levels based on the result of the valley search operation; and
performing the read operation for the selected memory cells by using the optimal read levels.

20. The method as claimed in claim 19, wherein the performing of the read operation for the selected memory cells by using the optimal read levels includes:
transmitting a set feature command including information about the optimal read levels to the nonvolatile memory device;
transmitting an address corresponding to the selected memory cells and a read command to the nonvolatile memory device; and
receiving data that is read using the optimal read levels, from the nonvolatile memory device.

* * * * *